(12) United States Patent
Shi et al.

(10) Patent No.: US 10,186,564 B2
(45) Date of Patent: Jan. 22, 2019

(54) CAPACITOR-DRIVEN ELECTROLUMINESCENT DISPLAY AND METHOD OF MANUFACTURING THE SAME

(71) Applicants: Yijian Shi, Mountain View, CA (US); Jiakun Jade Shi, Mountain View, CA (US)

(72) Inventors: Yijian Shi, Mountain View, CA (US); Jiakun Jade Shi, Mountain View, CA (US)

(73) Assignee: Yijian Shi, Mountain View, CA (US)

( * ) Notice: Subject to any disclaimer, the term of this patent is extended or adjusted under 35 U.S.C. 154(b) by 11 days.

(21) Appl. No.: 15/501,708

(22) PCT Filed: Aug. 3, 2015

(86) PCT No.: PCT/CN2015/000553
§ 371 (c)(1),
(2) Date: Feb. 3, 2017

(87) PCT Pub. No.: WO2016/019699
PCT Pub. Date: Feb. 11, 2016

(65) Prior Publication Data
US 2017/0229531 A1 Aug. 10, 2017

(30) Foreign Application Priority Data
Aug. 4, 2014 (CN) .......................... 2014 1 0379127

(51) Int. Cl.
*H01L 27/32* (2006.01)
*H01L 51/52* (2006.01)
(Continued)

(52) U.S. Cl.
CPC ......... *H01L 27/3265* (2013.01); *G09G 3/325* (2013.01); *H01L 27/326* (2013.01);
(Continued)

(58) Field of Classification Search
CPC ............... H01L 27/3246; H01L 27/326; H01L 27/3265; H01L 27/3276; H01L 27/3295;
(Continued)

(56) References Cited

U.S. PATENT DOCUMENTS

2007/0001936 A1* 1/2007 Kawakami .......... G09G 3/3208
345/76
2007/0247398 A1* 10/2007 Nathan ................ G09G 3/3233
345/82

(Continued)

*Primary Examiner* — Stephen W Smoot

(57) ABSTRACT

The subject invention provides a capacitor-drive electroluminescent display, which includes a display substrate, row and column electrodes that are deposited on the substrate, and the light-emitting pixel that is electrically connected to (and in between) the row and column electrodes, wherein the light-emitting pixel includes a light-emitting device, a drive capacitor, and a charging switch; wherein, the light-emitting device and the drive capacitor is electrically connected in parallel, which is then electrically connected to the charging switch; wherein, the row or column electrode has a light-emitting windows for installation of the electroluminescent devices. Meanwhile, the subject invention also provides a method for producing the capacitor-drive electroluminescent display.

20 Claims, 14 Drawing Sheets

(51) Int. Cl.
*H01L 51/00* (2006.01)
*H01L 51/56* (2006.01)
*G09G 3/325* (2016.01)

(52) U.S. Cl.
CPC ...... *H01L 27/3246* (2013.01); *H01L 27/3276* (2013.01); *H01L 27/3295* (2013.01); *H01L 51/0011* (2013.01); *H01L 51/0021* (2013.01); *H01L 51/5206* (2013.01); *H01L 51/5212* (2013.01); *H01L 51/5234* (2013.01); *H01L 51/56* (2013.01); *H01L 2227/323* (2013.01)

(58) Field of Classification Search
CPC ........... H01L 27/3297; H01L 2227/323; H01L 51/0011; H01L 51/0021; H01L 51/5212; H01L 51/5228; H01L 51/5234; H01L 51/56; G09G 3/3208; G09G 3/3233; G09G 3/325

See application file for complete search history.

(56) References Cited

U.S. PATENT DOCUMENTS

| | | | |
|---|---|---|---|
| 2010/0026729 A1* | 2/2010 | Toyomura | G09G 3/3233 345/690 |
| 2014/0204067 A1* | 7/2014 | Gupta | G09G 3/3233 345/211 |
| 2016/0126287 A1* | 5/2016 | Her | H01L 27/3279 257/88 |

* cited by examiner

PRIOR ART

PRIOR ART

CAPACITOR-DRIVEN ELECTROLUMINESCENT DISPLAY AND METHOD OF MANUFACTURING THE SAME

CROSS-REFERENCE TO RELATED APPLICATIONS

This application claims priority under 35 U.S.C. 119(b) and 37 CFR 1.55(d) to CN Patent Application No. 201410379127.9, filed Aug. 4, 2014, and PCT Patent Application No. PCT/CN2015/000553, filed Aug. 3, 2015.

TECHNICAL FIELD

The subject invention involves a drive technology for electroluminescent displays, particularly a capacitor driven electroluminescent display and the method of producing the same.

BACKGROUND OF THE INVENTION

Nowadays, electroluminescent displays such as organic light-emitting diode (OLED) displays are usually driven in either a passive matrix (PM) mode or an active matrix (AM) mode. An OLED display driven in the PM mode (named PMOLED) uses external driver circuitry that performs a voltage scanning of the display panel line by line alternately: that is, each line of pixels are lit alternately in sequence. Structurally, a PMOLED display panel consists of a set of electrodes that are arranged in the longitude direction (row electrodes) and a set of electrodes that are arranged in the latitude direction (column electrodes), wherein the electroluminescent organic layer is sandwiched in between the row and column electrodes (FIG. 1A). As shown in FIG. 1A, a PMOLED display panel (1000) consists of a substrate (1001), column electrodes (1002), the organic layer (1003), and row electrodes (1004). Generally, the substrate (1001) consists of a transparent material. The column electrode (1002) is usually the positive electrode, which consists of a transparent metal oxide layer such as indium tin oxide (ITO). The organic layer (1003) usually consists of multiple layers of functional organic materials, such as the hole injection (HI) layer, hole transporting (HT) layer, electron blocking (EB) layer, emissive (EM) layer, hole blocking (HB) layer, electron transporting (ET) layer, and electron injection (EI) layer, etc. The selected organic materials can be either polymeric materials or small molecule organic materials. In a tandem OLED, there are additional charge separation layers in between each individual OLED stack. The row electrode (1004) is usually the negative electrode and it is the common electrode for the same row the pixels. The pixel brightness is determined by the voltages applied to the column electrodes, $V_1, V_2, V_3 \ldots V_m$ (refer to FIG. 1A). The row electrodes are generally aluminum electrodes having a thickness of approximately 150 nm.

In this application, the meaning of the terminology "organic light-emitting diode" or "OLED" includes small molecule OLED, polymer OLED, and tandem OLED; the terminology "row electrode" refers to the electrode that is common to all pixels on the same electrode, and it can be either the positive electrode or the negative electrode; when the voltage value of a column electrode is addressed, it should be understood as the absolute value of the voltage.

FIG. 1B depicts the waveform of the scan-voltage pulses used in a PMOLED. In this driving mode, each row of pixels is switched on once within each scanning cycle, and the "switched-on time" of a pixel is inversely proportional to the number of row electrodes. Since the pixel's "switched-on time" is short, it is required that the pixel's brightness at the moment when it is switched on to be very high, in order to achieve a reasonable apparent brightness. For example, if a display panel of n rows is scanned with a perfect rectangular voltage waveforms at a frequency of z (Hz), the length of the scanning cycle ($\tau$) is $\tau=1/z$ (second); within each scanning cycle, the "switched-on time" for each row of pixels ($\Delta t_o$) is approximately $$\Delta t_o = \tau/n = 1/(nz) \text{ second}, \quad (1)$$

whereas, the pixel's "switched-off time" is $\tau(n-1)/n$ (second). In other words, there is only $1/n$ of the time that a pixel is switched on and there is $(n-1)/n$ of the time the pixel is switched off. If the average (apparent) brightness of a panel is $B_o$, the pixel brightness during its switched-on period ($B_p$) should be $B_p = B_o \times n$.

Therefore, when n is significantly large, the pixel brightness $B_p$ is much greater than the apparent brightness of the panel. This has resulted in a series of negative consequence, including reduced lifetime of the device, reduced electricity-to-light conversion efficiency of the device (the electricity-to-light conversion efficiency of most OLEDs decrease significantly at high brightness), and increased power consumption on the electrodes due to the increase of driving current. In addition, because an OLED device possesses a capacitance, when the scanning frequency is sufficiently high, the charge/discharge current may become significant that further increases the load on the driver circuitry and the power consumption on the electrodes, and reduces the power usage efficiency.

Limited by the maximum brightness that an OLED device can achieve and the conductivity of the electrodes, the size of a PMOLED display is generally no more than 100 lines. Therefore, PMOLEDs are only adapted for low-resolution and small-size (approximately 1 inch) displays. Although the multi-line addressing technology recently developed by DialogSemiconductor has boosted the performance of PMOLED in certain extent—240 lines, equivalent to ¼ VGA has been achieved—currently the resolution of a single PMOLED could hardly exceed the level of quarter VGA. For higher resolution (i.e. over 1000 lines) OLED displays (such as high-definition television, HDTV), the existing PMOLED approach cannot be used directly (unless tiling multiple PMOLEDs to form a larger display).

The AM driving mode uses an internal thin-film transistor (TFT) driver circuitry to control the brightness of the individual pixel independently, i.e. each pixel is controlled by a dedicated TFT driver built into the display backplane. The pixel brightness is determined by the amount of current delivered from the TFT driver (determined by the switched-on time, in case drive-current is constant). FIG. 2A illustrates the layout of an AMOLED, where the AMOLED display (2000) consists of a substrate (2001), an array of pixels consisting of anode (2002) and TFT driver (2003), the organic layer (2004), and cathode (2005). Wherein, the anode (2002) of each pixel is electrically connected to the output of the corresponding TFT driver, and cathode is the common electrode. In a "bottom-emitting" AMOLED, the anode is usually ITO and the cathode commonly uses aluminum or silver. In a "top-emitting" AMOLED, 2002 is a metal with high work-function and cathode 2005 is the transparent electrode.

FIG. 2B illustrates an example of a TFT driver circuitry used in an AMOLED. In this design, a pixel is controlled by a circuitry consisting of 4 TFTs ($T_1$, $T_2$, $T_3$, and $T_4$). Wherein, $V_{DD}$ is the positive pole of the power source, GND is the ground (the negative pole of power source), "Address line" is the driving line, and "Data line" is the data line.

The advantage of AMOLED is that its pixel does not require to work at a very high brightness, and therefore has longer lifetime and higher efficiency than PMOLED. As a result, it is currently adapted by most OLED displays. Theoretically, AMOLED can be used for high-resolution and large-screen displays. In practice, however, due to the huge amount of TFTs required, the complexity of the processes used to produce the TFT-backplane, the low yield, and limited by the material, currently only small-size (10-inch or below) AMOLEDs can be mass-produced. So far, none of the attempts in commercializing the mid-size and large-size (such as computer screens and large screen TVs) AMOLED are successful, due to the low manufacturing yield of the TFT backplane and the high production cost. On the other hand, the TFT driver circuitry itself consumes a significant amount of energy, which not only reduces the power usage efficiency but also, if used for a long period of time, produces a significant amount of heat that may raise the temperature and affects the lifetime of the device.

Additional technical details in regards to the driving method and construction of PMOLED and AMOLED displays can be found in US patents US20060091794, US20070114522, US20070152923, US20100085280, U.S. Pat. No. 5,952,789, U.S. Pat. No. 7,847,763, US 20130257845, US20130235023, and European patent EP2461311.

In an attempt to overcome the problems that PMOLED is incapable for making high-resolution and large-size panels while AMOLED is too expensive to produce, the US patent US2007/0001936A1 proposed a capacitor driving method that is different from either the conventional PM or AM mode. However, as described in US patent US2007/0001936A1, the electrodes used are basically the same as those in a conventional PMOLED. As a result, although US patent US2007/0001936A1 may be able to improve the efficiency and performance of existing PMOLED displays in a certain extent, the conductivity of the electrodes is still low and therefore cannot be practically adapted by the industry. In other words, the problem of electrodes having limited conductivity still exists in US patent US2007/0001936A1, and therefore it cannot fundamentally resolve the problems preventing PMOLED to be made high-resolution and large-size. Furthermore, there are several additional problems exist in the capacitor-drive technology described in US patent US2007/0001936A1, such as the circuit is too complicated, the manufacturing process too complex, production cost too high, and the OLED panel thickness increased, etc.

SUMMARY OF THE INVENTION

In order to resolve the aforementioned technical problems of existing technologies, the subject invention provides a capacitor-drive electroluminescent display, which includes a display substrate, row and column electrodes that are deposited on the substrate, and the light-emitting pixel that is electrically connected in between to the row and column electrodes, wherein the light-emitting pixel includes a light-emitting device, a drive capacitor, and a charging switch; wherein, the light-emitting device and the drive capacitor is electrically connected in parallel, which is then electrically connected to the charging switch; wherein, the row or column electrode has a light-emitting window for installation of the electroluminescent device.

Preferably, the light-emitting pixel also includes a middle electrode, wherein the electroluminescent device and the drive-capacitor is electrically connected in parallel to one side of the middle electrode, and the other side of the middle electrode is electrically connected to the charging switch.

Preferably, the row electrode or the column electrode is embedded into the display substrate.

Preferably, the light-emitting pixel also includes a first insulation layer and a second insulation layer, wherein the first insulation layer isolates and insulates the neighboring charging switches from one another, and the second insulation layer isolates and insulates the neighboring electroluminescent devices, the neighboring drive-capacitors, and the neighboring middle electrodes from one another.

Preferably, the display substrate is transparent and the electroluminescent device is deposited on the substrate via the light-emitting window.

Preferably, the light-emitting pixel also includes a first insulation layer and a second insulation layer, wherein the first insulation layer isolates and insulates the neighboring row or column electrodes, and the neighboring drive capacitors from one another; the second insulation layer isolates and insulates the neighboring charging switches, and the neighboring middle electrodes from one another.

Preferably, the second insulation layer and the dielectric layer of the drive-capacitor consists of the same material.

Preferably, the electroluminescent device includes a transparent electrode and an organic layer, wherein at least the transparent electrode is located in the light-emitting window and is electrically connected to the row or column electrode.

Preferably, the transparent electrode is deposited via a shadow mask on the organic layer and on the row or column electrode around the light-emitting window.

Preferably, the electroluminescent device includes a transparent electrode and an organic layer, wherein the transparent electrode and part of the organic layer is located within the light-emitting window and is electrically connected to the row or column electrode.

Preferably, the transparent electrode is coated on the substrate in the light-emitting window via deposition.

Preferably, the charging switch is directed fabricated on the row or column electrode.

Preferably, the charging switch is a diode.

Preferably, the middle electrode is obtained by metal coating on the charging switch.

The subject invention also provides a capacitor-drive electroluminescent display, which includes a display substrate, row and column electrodes that are deposited on the display substrate, and the light-emitting pixel that is electrically connected to the row and column electrodes; wherein, the light-emitting pixel includes an electroluminescent device, a drive-capacitor, a charging switch, a middle electrode, and an auxiliary electrode; wherein, one pole of the drive-capacitor is electrically connected to one side of the middle electrode, and the other pole to one side of the row or column electrode; one pole of the electroluminescent device is electrically connected to the other side of the row or column electrode, and the other pole to the middle electrode via the auxiliary electrode, while the other side of the middle electrode is electrically connected to the charging switch.

Preferably, the row or column electrode is embedded into the substrate.

Preferably, the light-emitting pixel also includes a first insulation layer, a second insulation layer, and a third insulation layer, wherein the first insulation layer isolates and insulates the neighboring charging switches from one another; the second insulation layer isolates and insulates the neighboring drive capacitors, and the neighboring middle electrodes from one another; and the third insulation layer isolates and insulates the neighboring row or column electrodes, and the neighboring electroluminescent devices from each other.

Preferably, the second insulation layer and the dielectric layer of the drive-capacitor consists of the same material.

Preferably, the electroluminescent device includes a transparent electrode and an organic layer, wherein the transparent electrode is electrically connected to the auxiliary electrode.

Preferably, the transparent electrode is deposited via a shadow mask on the organic layer and on the relevant area of the auxiliary electrode.

Preferably, the charging switch is produced directly on the row or column electrode.

Preferably, the charging switch is a diode.

Preferably, the middle electrode is obtained by metal coating on the charging switch.

In another aspect, the subject invention also provides a method for forming a capacitor-drive electroluminescent display, which involves: depositing the column electrodes on the display substrate; depositing the charging switch to the relevant position of the display substrate; depositing the drive-capacitor to the relevant position of the display substrate; depositing the electroluminescent device to the relevant position of the display substrate; and depositing the row electrode on the display substrate; wherein, the electroluminescent device and the drive-capacitor are electrically connected to one side of the middle electrode in parallel, whereas the other side of the middle electrode is electrically connected to the charging switch.

Preferably, the fabrication method also involves depositing the middle electrodes in the relevant position of the display substrate.

Preferably, deposit column or row electrode on the display substrate; deposit the charging switch to the relevant position of the column or row electrode; planarize the display substrate bearing the charging switches with the first insulating material; deposit the middle electrode on the charging switch; deposit the second insulating material on the substrate bearing the middle electrodes; etch the second insulating material at the position corresponding to the middle electrode to form the first cavity for accommodating the drive-capacitor, wherein there is a certain amount of the second insulating material remained in the first cavity; deposit the material constituting the drive-capacitor into the first cavity; deposit the row or column electrode in correspondence with the middle electrode; etch the row or column electrode at the position corresponding to the certain amount of the second insulating material to form the light-emitting window, and remove the certain amount of the second insulating material to form the second cavity; deposit the electroluminescent device into the second cavity, such that the electroluminescent device is electrically connected to the middle electrode.

Preferably, deposit the column or row electrode on the display substrate; deposit the first insulating material on the substrate bearing the column or row electrode; etch the first insulating material at the position corresponding to the column or row electrode to form an array of the fourth cavity that is prepared for accommodating the charging switch; deposit the charging switch into the fourth cavity; deposit the middle electrode on the charging switch; deposit the second insulating material on the substrate bearing the middle electrode; etch the second insulating material in the position corresponding to on the middle electrode to form the first cavity that is prepared for accommodating the drive-capacitor, wherein there is a certain amount of the second insulating-material remained in the first cavity; deposit the material constituting the drive-capacitor into the first cavity; deposit the row or column electrode in correspondence with the middle electrode; etch the row or column electrode at the position corresponding to the certain amount of the second insulating material to form the light emitting window, and remove the certain amount of the second insulating material to form the second cavity; deposit the electroluminescent device into the second cavity, such that the electroluminescent device is electrically connected to the middle electrode.

Preferably, deposit the column or row electrode on the display substrate; deposit the first insulating material on the substrate bearing the column or row electrode; etch the first insulating material at the position corresponding to the column or row electrode to form an array of the fourth cavity that is prepared for accommodating the charging switch; deposit the charging switch into the fourth cavity; deposit the middle electrode on the charging switch; deposit the material constituting the drive-capacitor on the substrate bearing the middle electrode; deposit the row or column electrode on the material constituting the drive-capacitor in correspondence with the middle electrode; etch the row or column electrode at the position corresponding to the middle electrode to form the light-emitting window, and etch the material layer constituting the drive-capacitor at the position corresponding to the middle electrode to form the second cavity; deposit the electroluminescent device into the second cavity, such that the electroluminescent device is electrically connected to the middle electrode.

Preferably, deposit the column or row electrode on the display substrate; deposit the first insulating material on the substrate bearing the column or row electrode; etch the first insulating material at the position corresponding to the column or row electrode to form an array of the fourth cavity that is prepared for accommodating the charging switch; deposit the charging switch into the fourth cavity; deposit the middle electrode on the charging switch; deposit the material constituting the drive-capacitor on the substrate bearing the middle electrode, and etch an array of the drive-capacitors at the position corresponding to the middle electrode; planarize the substrate bearing the drive-capacitors with the second insulating material; deposit the row or column electrode, in correspondence with the middle electrode, on the display substrate planarized with the second insulating material; etch the row or column electrode at the position corresponding to the middle electrode to form the light-emitting window, and etch the second insulating material at the position corresponding to the middle electrode to form the second cavity; deposit the electroluminescent device into the second cavity, such that the electroluminescent device is electrically connected to the middle electrode.

Preferably, deposit the column or row electrode on the display substrate; deposit the charging switch to the relevant position on the column or row electrode; planarize the display substrate bearing the charging switch with the first insulating material; deposit the middle electrode on the charging switch; deposit the material constituting the drive-capacitor on the display substrate bearing the middle electrode; deposit the row or column electrode on the material layer constituting the drive-capacitor in correspondence with the middle electrode; etch the row or column electrode at the position corresponding to the middle electrode to form the light-emitting window, and etch the material layer constituting the drive-capacitor at the position corresponding to the middle electrode to form the second cavity; deposit the electroluminescent device into the second cavity, such that the electroluminescent device is electrically connected to the middle electrode.

Preferably, deposit the column or row electrode on the display substrate; deposit the charging switch to the relevant position on the column or row electrode; planarize the display substrate bearing the charging switch with the first insulating material; deposit the middle electrode on the charging switch; deposit the material constituting the drive-capacitor on the display substrate bearing the middle electrode, and etch an array of the drive-capacitor; planarize the display substrate bearing the drive-capacitor array with the second insulating material; deposit the row or column electrode, in correspondence with the middle electrode, on the display substrate planarized with the second insulating material; etch the row or column electrode at the position corresponding to the middle electrode to form the light-emitting window, and etch the second insulating material at the position corresponding to the middle electrode to form the second cavity; deposit the electroluminescent device into the second cavity, such that the electroluminescent device is electrically connected to the middle electrode.

Preferably, etch the display substrate to produce the third cavity (ditch) that is prepared for accommodating the column or row electrode, then fill the third cavity (ditch) with electrode material to form the column or row electrode.

Preferably, heat the display substrate that is consisting of a thermoplastic substance or contains a layer of a thermoplastic substance at the surface, then press the column or row electrode into the thermally softened surface of the display substrate.

Preferably, form an electroluminescent device by depositing the organic layer into the second cavity, then depositing on top of the organic layer a transparent electrode that is electrically connected to the row or column electrode around the light-emitting window, wherein at least the transparent electrode is located in the light-emitting window.

Preferably, the transparent electrode is deposited, via a shadow mask, on top of the organic layer and on the row or column electrode around the light-emitting window.

Preferably, the charging switch is produced directly on the row or column electrode.

Preferably, the middle electrode is obtained by metal coating on the charging switch.

The subject invention further provides a method for forming a capacitor-drive electroluminescent display, which involves: depositing the column electrode on the display substrate; deposit the charging switch to the relevant position of the display substrate; depositing the middle electrode at the relevant position of the display substrate; depositing the drive-capacitor to the relevant position of the display substrate; depositing the electroluminescent device to the relevant position of the display substrate; depositing the auxiliary electrode to the relevant position of the display substrate; depositing the row electrode on the display substrate; wherein, the electroluminescent device and the drive-capacitor is located at the opposite side of the column or row electrode, and the drive-capacitor is located in between the middle electrode and the column or row electrode; the auxiliary electrode electrically connect the electroluminescent device to the middle electrode, such that the electroluminescent device and the drive-capacitor is electrically connected in parallel.

Preferably, deposit the column or row electrode on the display substrate; deposit the charging switch to the relevant position of the column or row electrode; planarize the display substrate bearing the charging switch with the first insulating material; deposit the middle electrode on the charging switch; deposit the second insulating material on the display substrate bearing the middle electrode; etch the second insulating material in the position corresponding to the middle electrode to form the first cavity that is prepared for accommodating the drive-capacitor; deposit the material constituting the drive-capacitor into the first cavity; deposit the row or column electrode in correspondence with the middle electrode; deposit the third insulating material on the row or column electrode; etch the third insulating material in the position corresponding to the middle electrode to produce the second cavity that is prepared for accommodating the electroluminescent device, and to produce the channel for the auxiliary electrode to reach the middle electrode; deposit the auxiliary electrode into the channel; deposit the electroluminescent device into the second cavity such that the electroluminescent device is electrically connected to the auxiliary electrode and the row or column electrode.

Preferably, deposit the column or row electrode on the display substrate; deposit the first insulating material on the display substrate bearing the column or row electrode; etch the first insulating material at the relevant position of the column or row electrode to form an array of the fourth cavity that is prepared for accommodating the charging switch; deposit the charging switch into the fourth cavity; deposit the middle electrode on the charging switch; deposit the second insulating material on the display substrate bearing the middle electrode; etch the second insulating material in the position corresponding to the middle electrode to form the first cavity that is prepared for accommodating the drive-capacitor; deposit the material constituting the drive-capacitor into the first cavity; deposit the row or column electrode in correspondence with the middle electrode; deposit the third insulating material on the row or column electrode; etch the third insulating material in the position corresponding to the middle electrode to produce the second cavity that is prepared for accommodating the electroluminescent device, and to produce the channel for the auxiliary electrode to reach the middle electrode; deposit the auxiliary electrode into the channel; deposit the electroluminescent device into the second cavity, such that the electroluminescent device is electrically connected to the auxiliary electrode and to the row or column electrode.

Preferably, deposit the column or row electrode on the display substrate; deposit the first insulating material on the substrate bearing the column or row electrode; etch the first insulating material at the relevant position of the column or row electrode to produce an array of the fourth cavity that is prepared for accommodating the charging switch; deposit the charging switch into the fourth cavity; deposit the middle electrode on the charging switch; deposit the material constituting the drive-capacitor on the display substrate bearing the middle electrode; deposit the row or column electrode, in correspondence with the middle electrode, on the material constituting the drive capacitor; deposit the third insulating material on the row or column electrode; etch the third insulating material in the position corresponding to the middle electrode to produce the second cavity that is prepared for accommodating the electroluminescent device, and to produce the channel for the auxiliary electrode to reach the middle electrode; deposit the auxiliary electrode into the channel; deposit the electroluminescent device into the second cavity, such that the electroluminescent device is electrically connected to the auxiliary electrode and to the row or column electrode.

Preferably, deposit the column or row electrode on the display substrate; deposit the first insulating material on the substrate bearing the column or row electrode; etch the first insulating material at the relevant position of the column or row electrode to produce an array of the fourth cavity that is prepared for accommodating the charging switch; deposit the charging switch into the fourth cavity; deposit the middle electrode on the charging switch; deposit the material constituting the drive-capacitor on the display substrate bearing the middle electrode, and etch an array of the drive-capacitor; planarize the display substrate bearing the drive-capacitor with the second insulating material; deposit the row or column electrode, in correspondence with the middle electrode, on the display substrate planarized with the second insulating material; deposit the third insulating material on the row or column electrode; etch the third insulating material in the position corresponding to the middle electrode to produce the second cavity that is prepared for accommodating the electroluminescent device, and to produce the channel for the auxiliary electrode to reach the middle electrode; deposit the auxiliary electrode into the channel; deposit the electroluminescent device into the second cavity, such that the electroluminescent device is electrically connected to the auxiliary electrode and to the row or column electrode.

Preferably, deposit the column or row electrode on the display substrate; deposit the charging switch to the relevant position of the column or row electrode; planarize the display substrate bearing the charging switch with the first insulating material; deposit the middle electrode on the charging switch; deposit the material constituting the drive-capacitor on the substrate bearing the middle electrode; deposit the row or column electrode, in correspondence with the middle electrodes, on the material constituting the drive capacitor; deposit the third insulating material on the row or column electrode; etch the third insulating material in the position corresponding to the middle electrode to produce the second cavity that is prepared for accommodating the electroluminescent device, and to produce the channel for the auxiliary electrode to reach the middle electrode; deposit the auxiliary electrode into the channel; deposit the electroluminescent device into the second cavity, such that the electroluminescent device is electrically connected to the auxiliary electrode and to the row or column electrode.

Preferably, deposit the column or row electrode on the display substrate; deposit the charging switch to the relevant position of the column or row electrode; planarize the display substrate bearing the charging switch with the first insulating material; deposit the middle electrode on the charging switch; deposit the material constituting the drive-capacitor on the substrate bearing the middle electrode, and etch an array of the drive-capacitor; planarize the substrate bearing the drive-capacitor array with the second insulating material; deposit the row or column electrode, in correspondence with the middle electrode, on the substrate planarized with the second insulating material; deposit the third insulating material on the row or column electrode; etch the third insulating material in the position corresponding to the middle electrode to produce the second cavity that is prepared for accommodating the electroluminescent device, and to produce the channel for the auxiliary electrode to reach the middle electrode; deposit the auxiliary electrode into the channel; deposit the electroluminescent device into the second cavity, such that the electroluminescent device is electrically connected to the auxiliary electrode and to the row or column electrode.

Preferably, etch the display substrate to produce the third cavity (ditch) that is prepared for accommodating the column or row electrode, then fill the third cavity (ditch) with electrode material to form the column or row electrode.

Preferably, heat the display substrate that is consisting of a thermoplastic substance or contains a layer of a thermoplastic substance at the surface, then press the column or row electrode into the thermally softened surface of the display substrate.

Preferably, form the electroluminescent device by depositing the organic layer into the second cavity, then depositing on top of the organic layer a transparent electrode, which is electrically connected to the auxiliary electrode.

Preferably, the transparent electrode is deposited on top of the organic layer and on the auxiliary electrode via a shadow mask.

Preferably, the charging switch is produced directly on the column or row electrode.

Preferably, the middle electrode is obtained by metal coating on the charging switch.

The subject invention further provides a method for forming a capacitor-drive electroluminescent display, which involves: depositing the column electrode on a transparent display substrate; depositing the electroluminescent devices directly on to the transparent display substrate; depositing the drive-capacitor to the relevant position of the transparent display substrate; depositing the charging switch to the relevant position of the transparent display substrate; depositing the row electrode on the transparent display substrate; wherein, the electroluminescent device and the drive-capacitor are electrically connected in parallel, which is then electrically connected to the charging switch.

Preferably, the method also involves: depositing the middle electrode to the relevant position of the transparent display substrate; wherein, the electroluminescent device and the drive-capacitor are electrically connected in parallel to one side of the middle electrode, while the other side of the middle electrode is electrically connected to the charging switch.

Preferably, deposit the transparent electrode on the transparent display substrate according to a predetermined array; deposit the column or row electrode on the transparent display substrate according to the predetermined array; etch the column or row electrode at the position corresponding to the transparent electrode to form the light-emitting window; deposit the first insulating material on the column or row electrode bearing the light-emitting window; etch the first insulating material at the position corresponding to the column or row electrode to form the first cavity that is prepared for accommodating the drive-capacitor, wherein there is a certain amount of the first insulating material remained in the first cavity; deposit the material constituting the drive capacitor into the first cavity; remove the certain amount of the first insulating material to form the second cavity; deposit the organic layer into the second cavity, such that the organic layer together with the transparent electrode form the electroluminescent device; deposit the middle electrode on the electroluminescent device and on the material constituting the drive-capacitor; deposit the charging switch on the middle electrode; deposit the second insulating material on the transparent display substrate bearing the charging switch, wherein the second insulating material does not cover the charging switch; deposit the row or column electrode in accordance with the charging switch.

Preferably, deposit the transparent electrode on the transparent display substrate according to a predetermined array; deposit the column or row electrode on the transparent display substrate according to the predetermined array; etch the column or row electrode at the position corresponding to the transparent electrode to form the light-emitting window; deposit the material constituting the drive-capacitor on the column or row electrode bearing the light-emitting window, and etch an array of the drive-capacitor in accordance with the predetermined array; planarize the transparent display substrate bearing the drive-capacitor array with the first insulating layer; on the transparent display substrate planarized with the first insulating layer, etch the second cavity in the position corresponding to the transparent electrode; deposit the organic layer into the second cavity, such that the organic layer together with the transparent electrode form the electroluminescent device; deposit the middle electrode on the electroluminescent device, wherein the area of the middle electrode is greater than that of the electroluminescent device and as a result, the middle electrode covers the electroluminescent device as well as part of the material constituting the drive-capacitor; deposit the second insulating layer on the transparent display substrate bearing the middle electrode; etch the transparent display substrate that is planarized with the second insulating layer material in the position corresponding to the middle electrode to form the third cavity, which is prepared for accommodating the charging switch; deposit the charging switch into the third cavity; deposit the row or column electrode in accordance with the charging switch.

Preferably, deposit the transparent electrode on the transparent display substrate according to a predetermined array; deposit the column or row electrode on the transparent display substrate in accordance with the predetermined array; etch the column or row electrode at the position corresponding to the transparent electrode to form the light-emitting window; deposit the material constituting the drive-capacitor on the column or row electrode bearing the light-emitting window; etch the material layer constituting the drive-capacitor in the position corresponding to the transparent electrode to form the second cavity; deposit the organic layer into the second cavity, such that the organic layer together with the transparent electrode form the electroluminescent device; deposit the middle electrode on the electroluminescent device, wherein the area of the middle electrode is greater than that of the electroluminescent device and as a result, the middle electrode covers the electroluminescent device as well as part of the material constituting the drive-capacitor; deposit the second insulating layer on the transparent display substrate bearing the middle electrode; etch the transparent substrate that is planarized with the second insulating layer in the position corresponding to the middle electrode to form the third cavity, which is prepared for accommodating the charging switch; deposit the charging switch into the third cavity; deposit the row or column electrode in accordance with the charging switch.

Preferably, deposit the transparent electrode on the transparent display substrate according to a predetermined array; deposit the column or row electrode on the transparent display substrate in accordance with the predetermined array; etch the column or row electrode at the position corresponding to the transparent electrode to form the light-emitting window; deposit the first insulating material on the column or row electrode bearing the light-emitting window; etch the first insulating material at the position corresponding to the column or row electrode to form the first cavity, which is prepared for accommodating the drive-capacitor, wherein there is a certain amount of the first insulating material remained in the first cavity; deposit the material constituting the drive capacitor into the first cavity; remove the certain amount of the first insulating material, to form the second cavity; deposit the organic layer into the second cavity, such that the organic layer together with the transparent electrode form the electroluminescent device; deposit the middle electrode on the electroluminescent device and on the material constituting the drive-capacitor; deposit the second insulating layer on the transparent display substrate bearing the middle electrode; etch the transparent display substrate that is planarized with the second insulating layer material in the position corresponding to the middle electrode to form the third cavity, which is prepared for accommodating the charging switch; deposit the charging switch into the third cavity; deposit the row or column electrode in accordance with the charging switch.

Preferably, deposit the transparent electrode on the transparent display substrate according to a predetermined array; deposit the column or row electrode on the transparent display substrate in accordance with the predetermined array; etch the column or row electrode at the position corresponding to the transparent electrode to form the light-emitting window; deposit the material constituting the drive-capacitor on the column or row electrode bearing the light-emitting window, and etch an array of the drive-capacitor; planarize the transparent display substrate bearing the drive-capacitor with the first insulating layer; etch the transparent substrate planarized with the first insulating layer in the area corresponding to the transparent electrode to form the second cavity; deposit the organic layer into the second cavity, such that the organic layer together with the transparent electrode form the electroluminescent device; deposit the middle electrode on the electroluminescent device, wherein the area of the middle electrode is greater than that of the electroluminescent device and as a result, the middle electrode covers the electroluminescent device as well as part of the material constituting the drive capacitor; deposit the charging switch on the middle electrode; deposit the second insulating material on the transparent display substrate bearing the charging switch, wherein the second insulating material does not cover the charging switch; deposit the row or column electrode in accordance with the charging switch.

Preferably, deposit the transparent electrode on the transparent display substrate according to a predetermined array; deposit the column or row electrode on the transparent display substrate in accordance with the predetermined array; etch the column or row electrode at the position corresponding to the transparent electrode to form the light-emitting window; deposit the material constituting the drive-capacitor on the column or row electrode bearing the light-emitting window; etch the material layer constituting the drive-capacitor in the area corresponding to the transparent electrode to form the second cavity; deposit the organic layer into the second cavity, such that the organic layer together with the transparent electrode form the electroluminescent device; deposit the middle electrode on the electroluminescent device, wherein the area of the middle electrode is greater than that of the electroluminescent device and as a result, the middle electrode covers the electroluminescent device as well as part of the material constituting the drive-capacitor; deposit the charging switch on the middle electrode; deposit the second insulating material on the transparent display substrate bearing the charging switch, wherein the second insulating material does not cover the charging switch; deposit the row or column electrode in accordance with the charging switch.

Preferably, deposit a nanometer-scale transparent electrode on the transparent display substrate via a coating method.

Preferably, deposit the organic layer into the light-emitting window, so that at least part of the organic layer is within the light-emitting window.

Preferably, the charging switch is produced directly on the middle electrode.

Preferably, deposit onto the electroluminescent device a protective metal layer that is greater than the electroluminescent device, then deposit another metal layer of certain thickness, and the middle electrode is obtained after performing a photolithography process.

Preferably, the depth of the first cavity is sufficient to accommodate a stack of multiple electroluminescent devices.

In comparison with conventional PMOLED and AMOLED, Cap-OLED has the following advantages: simplified fabrication process and reduced production cost; reduced thickness of the display panel; the row and column electrode of Cap-OLED have very low resistance, and therefore can conduct a high current without producing a significant amount of heat; since the charging switch prevents the capacitor from discharging via the external circuit (i.e. the row and column electrodes), the energy usage efficiency is significantly improved; since the pixel's switched-on time is significantly extended by the drive capacitor, the pixel's initial brightness of a Cap-OLED is much lower than the pixel's transient brightness of a PMOLED, therefore the lifetime of a Cap-OLED is much longer than a PMOLED; Cap-OLED can be used for high resolution, large size displays. In theory, the energy usage efficiency of a Cap-OLED can be as high as 90%, which is not only much greater than that of a PMOLED, but also significantly higher than that of an AMOLED. Currently, the energy usage efficiency of an AMOLED is approximately 50% (the TFT circuitry consumes approximately 50% of the power).

BRIEF DESCRIPTION OF THE DRAWINGS

Brief Description of the Drawings

Figure 1A:
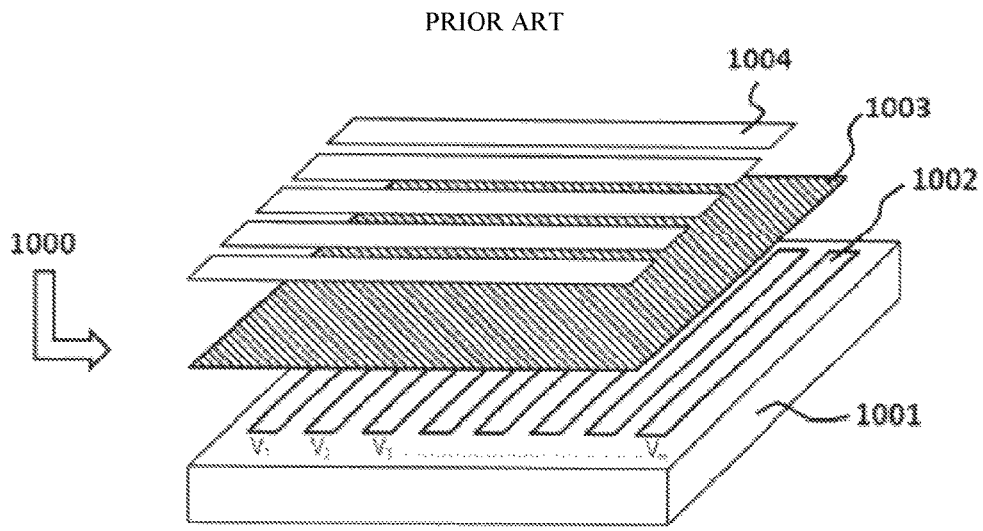

FIG. 1A is a diagrammatic sketch of the existing PMOLED.

Figure 1B:
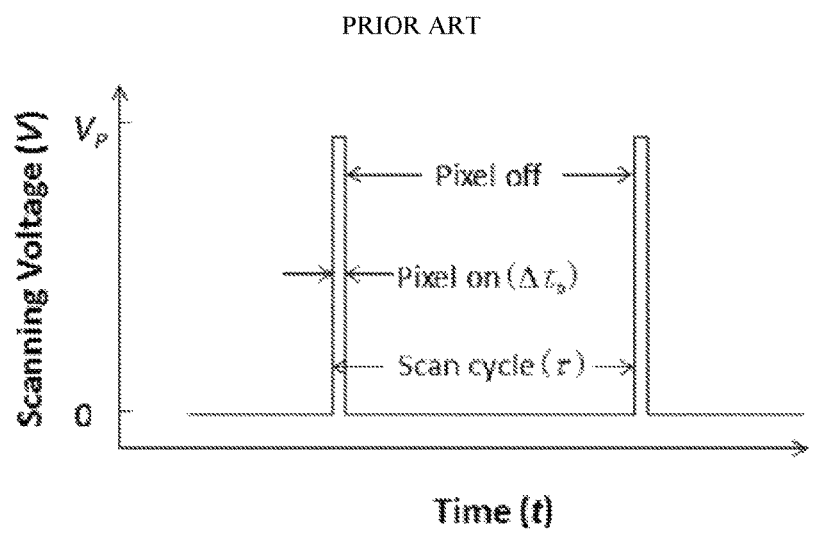

FIG. 1B is a sketch of the scanning voltage pulses used in existing PMOLED.

Figure 2A:
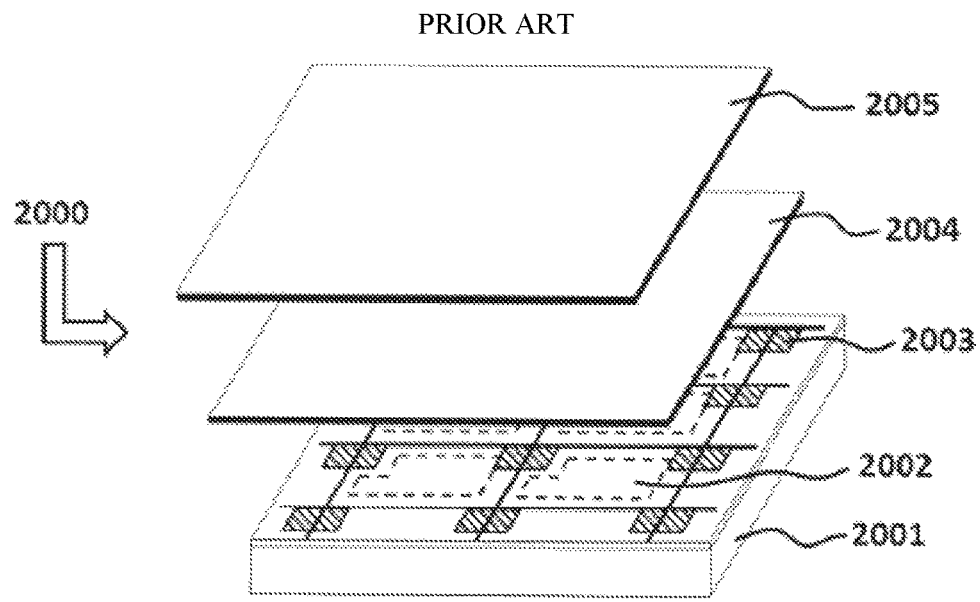

FIG. 2A is a diagrammatic sketch of the existing AMOLED.

Figure 2B:
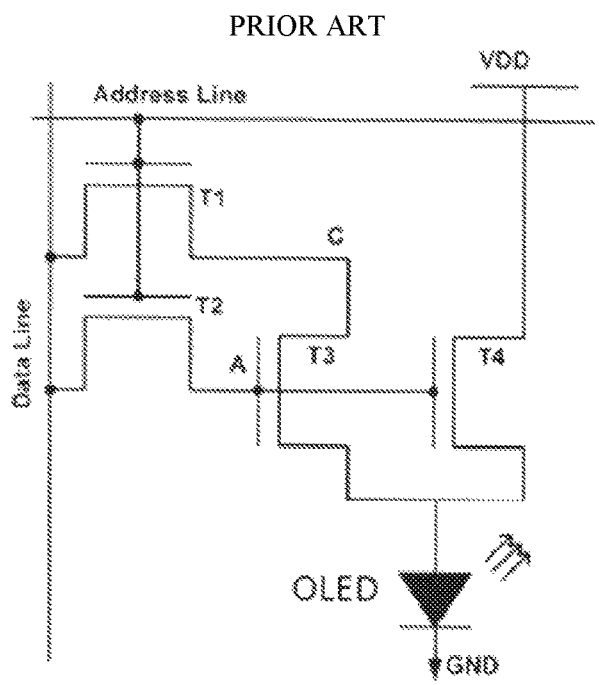

FIG. 2B is an exemplary TFT driver circuitry used in existing AMOLEDs.

Figure 3A:
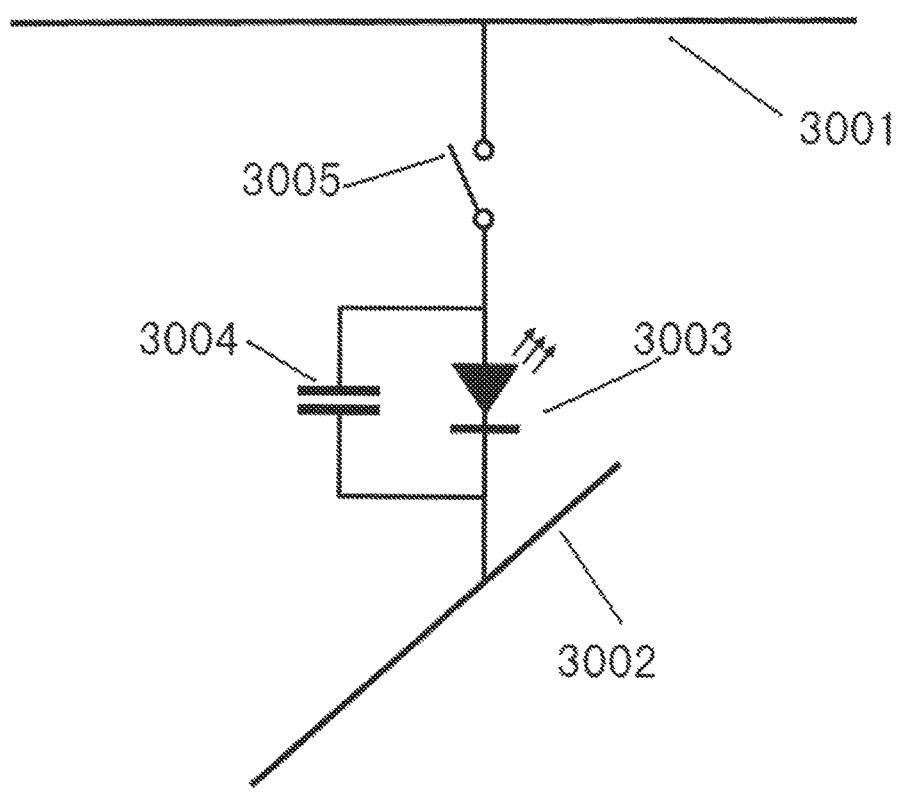

FIG. 3A is the schematic of a Cap-OLED circuitry.

Figure 3B:
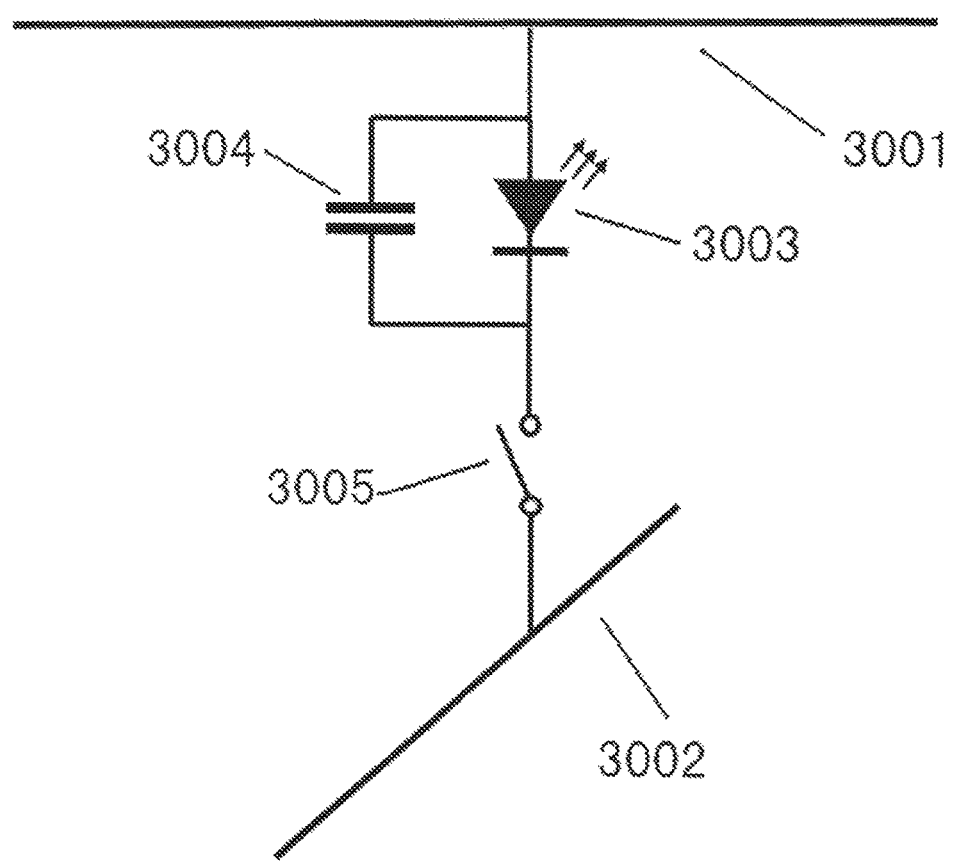

FIG. 3B is the schematic of another Cap-OLED circuitry.

Figure 3C:
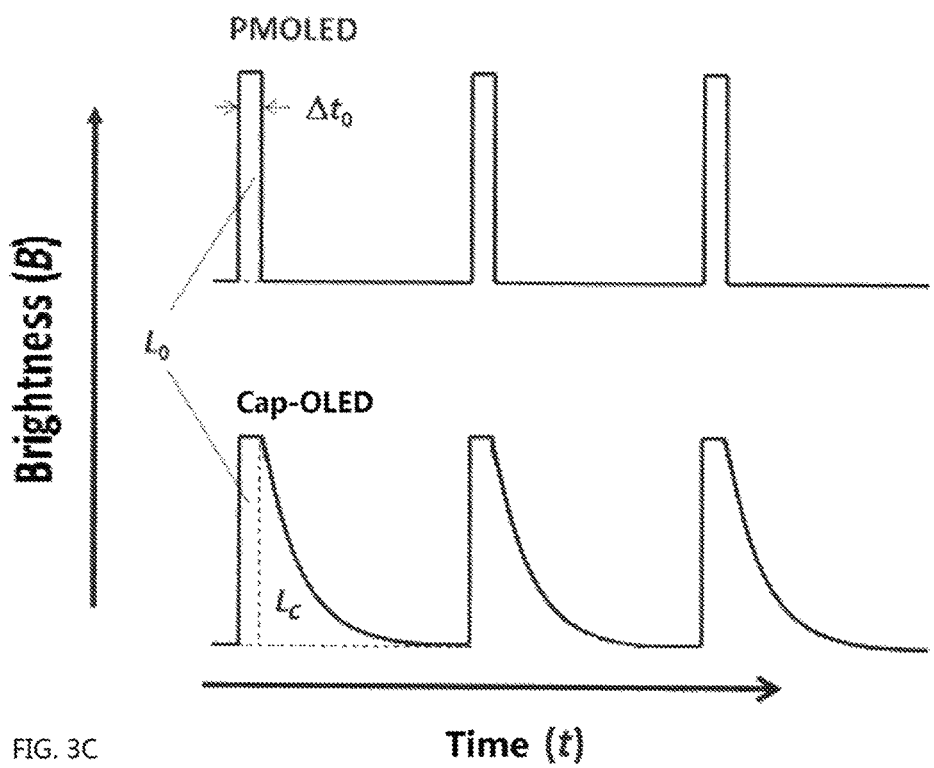

FIG. 3C is a comparison of the "Brightness-Time" diagram for a Cap-OLED circuit v.s. a PMOLED circuit.

Figure 3D:
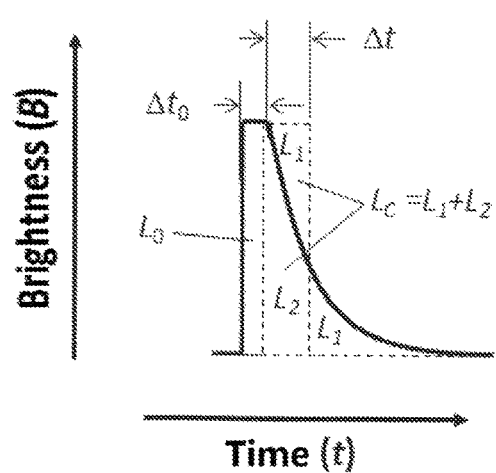

FIG. 3D illustrates the "Brightness-Time" curve of a Cap-OLED circuit and schematically depicts the definition for the extension of the device's light-emitting time (Δt).

Figure 4:
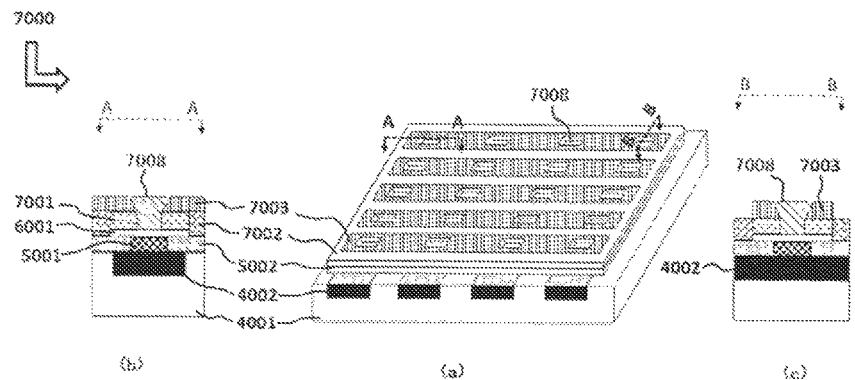

FIG. 4 is a diagrammatic sketch for a Cap-OLED display using a "parallel" configuration.

Figure 5:
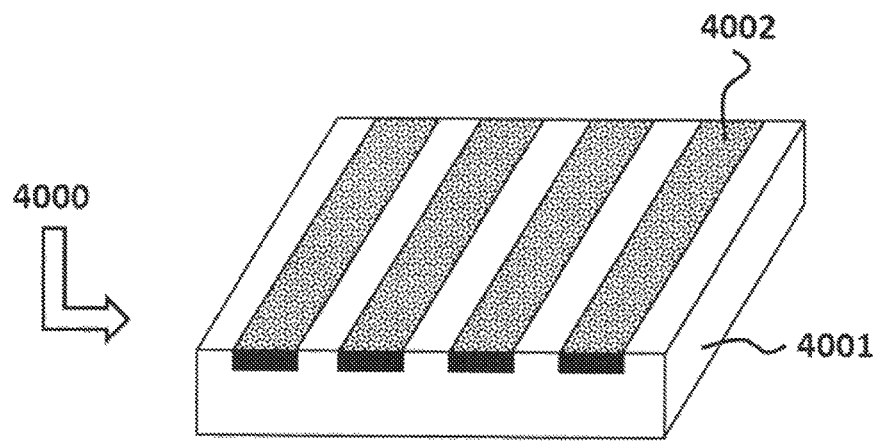

FIG. 5 illustrates an example of row electrodes embedded into the substrate.

Figure 6:
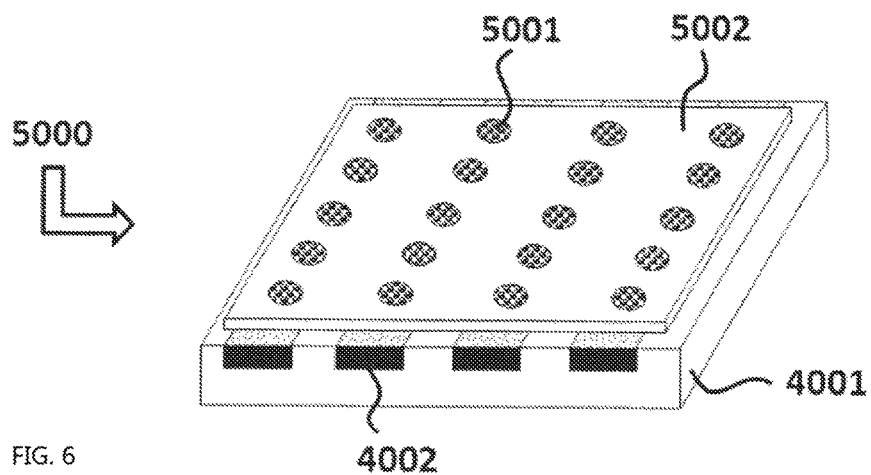

FIG. 6 illustrates an example of the substrate after deposition of the charging switches.

Figure 7:
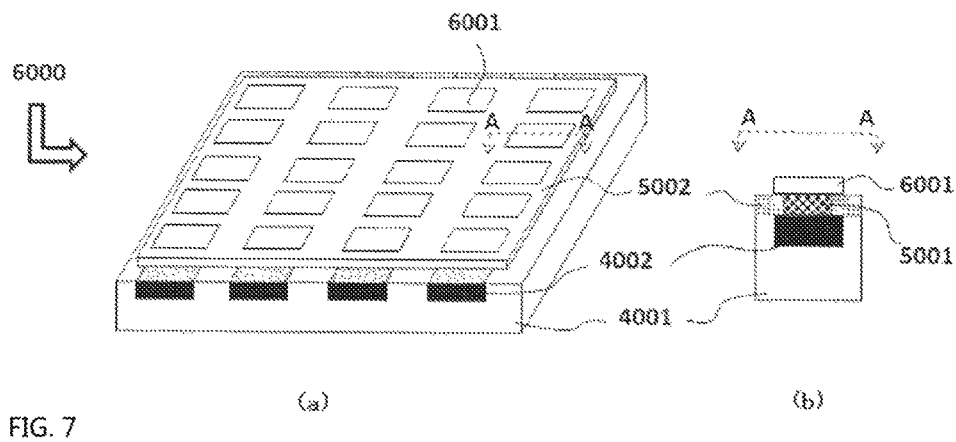

FIG. 7 illustrates an example of the substrate after deposition of the middle electrodes.

Figure 8:
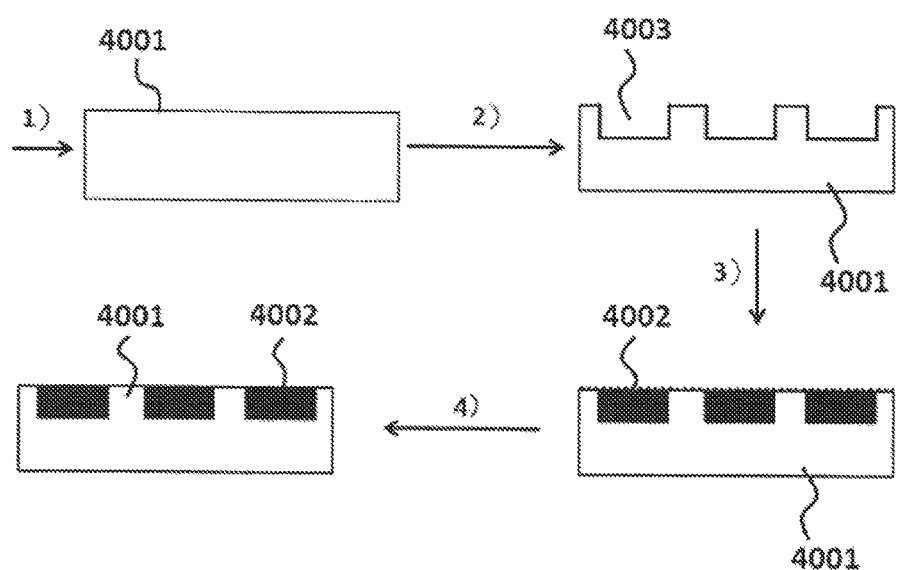

FIG. 8 schematically illustrates an exemplary method for producing component 4000.

Figure 9:
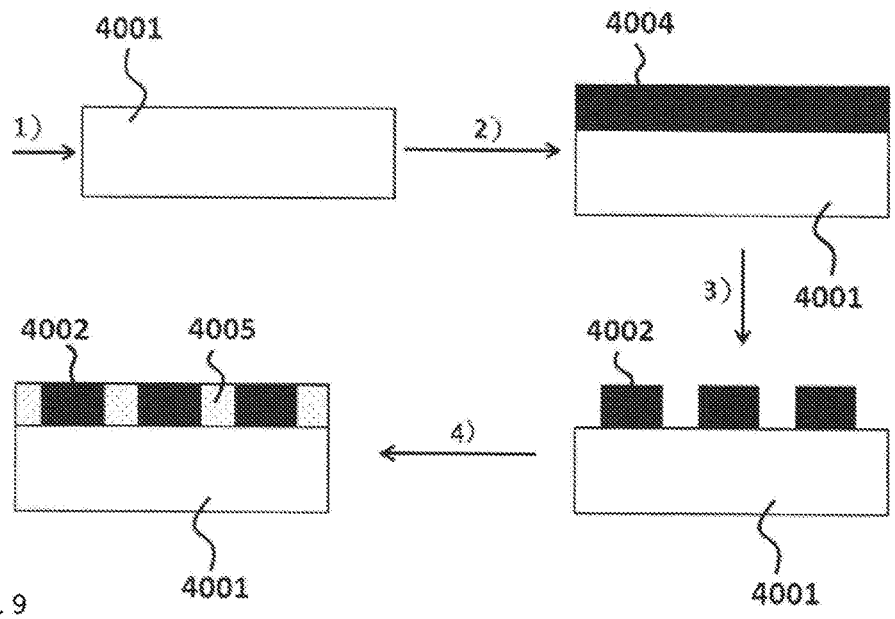

FIG. 9 schematically illustrates another exemplary method for producing component 4000.

Figure 10:
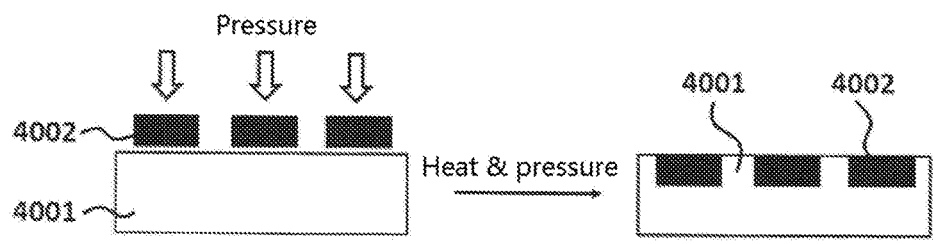

FIG. 10 schematically illustrates another exemplary method for producing component 4000.

Figure 11:
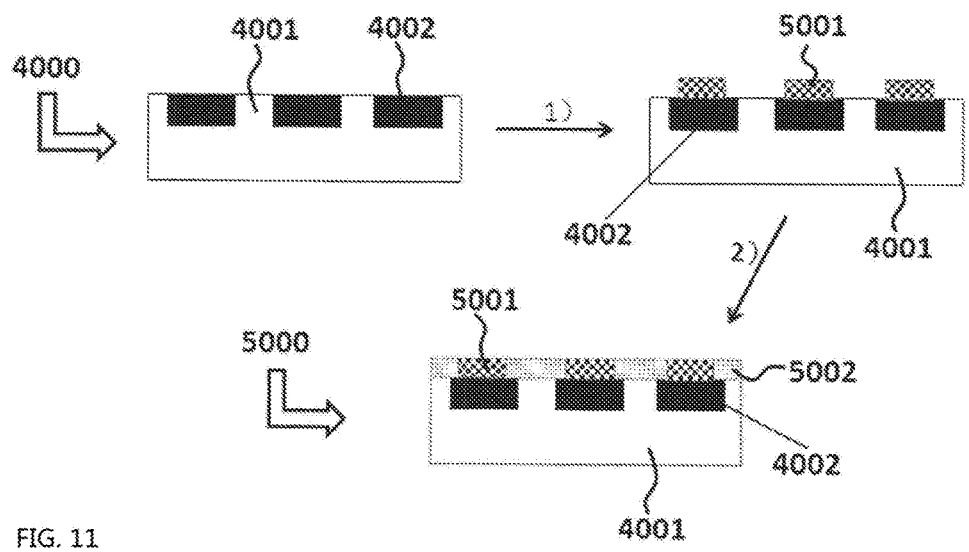

FIG. 11 schematically illustrates an exemplary method for producing component 5000.

Figure 12:
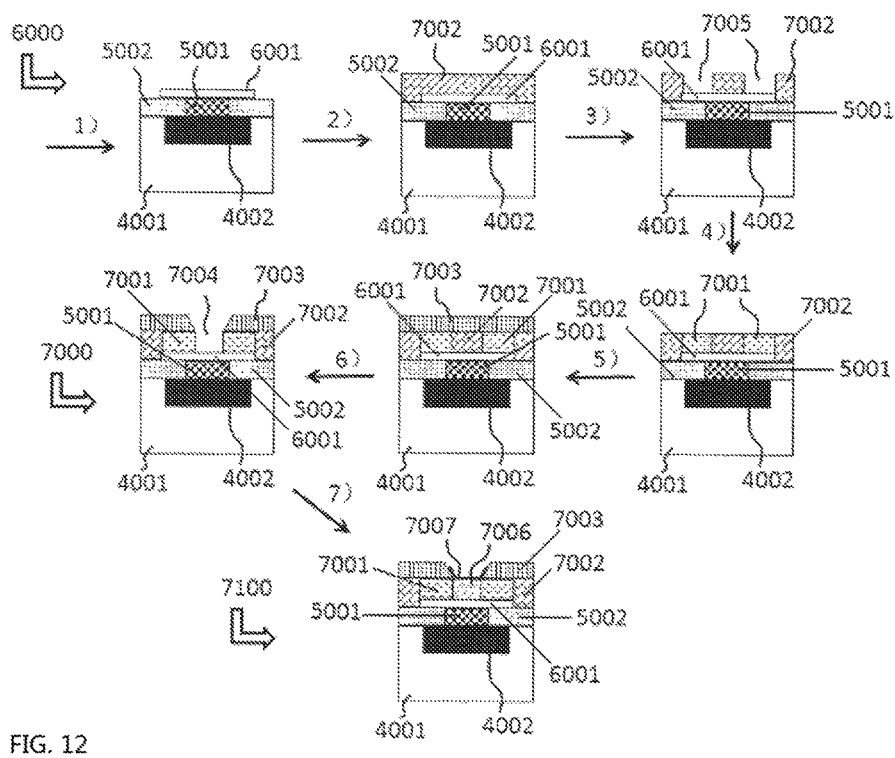

FIG. 12 schematically illustrates an exemplary method for producing a "parallel" type of Cap-OLED display.

Figure 13A:
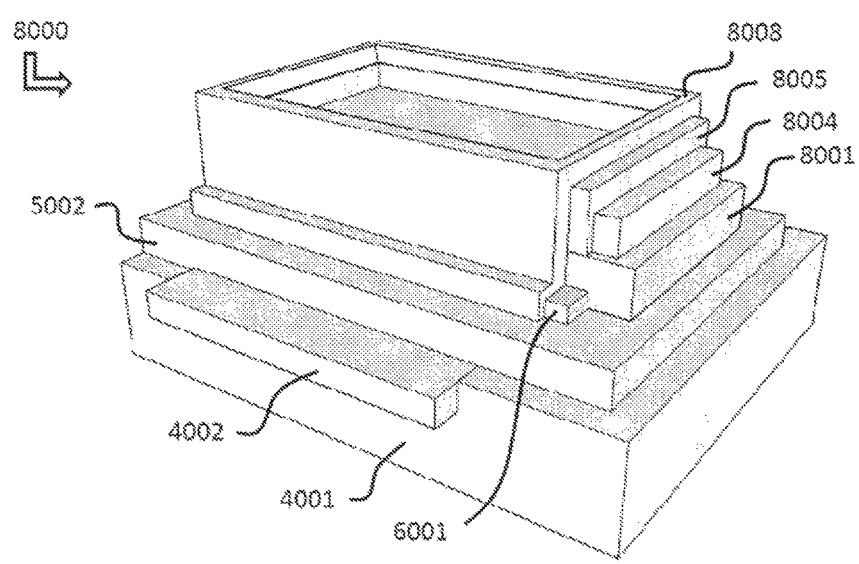
Figure 13B:
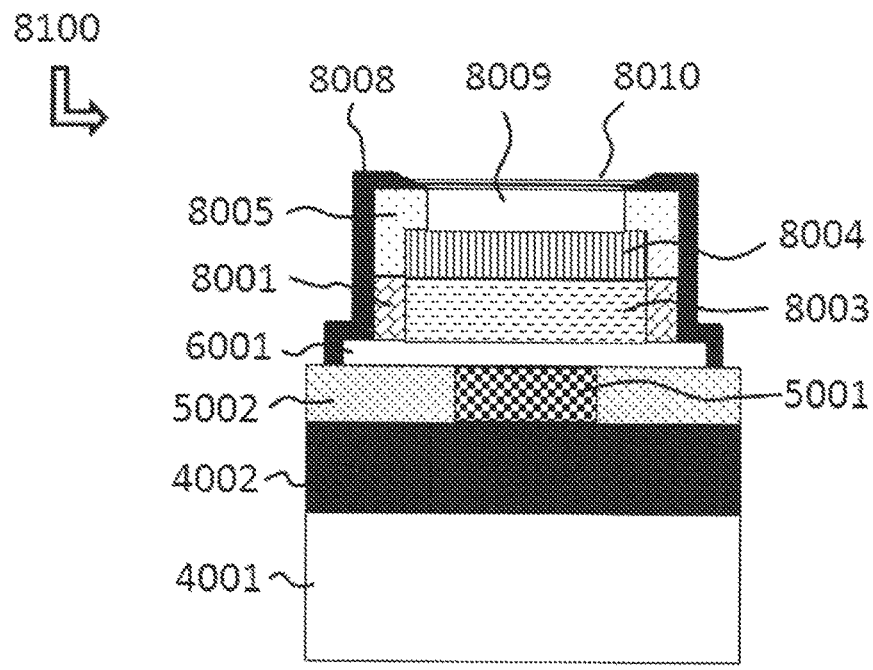
Figure 13C:
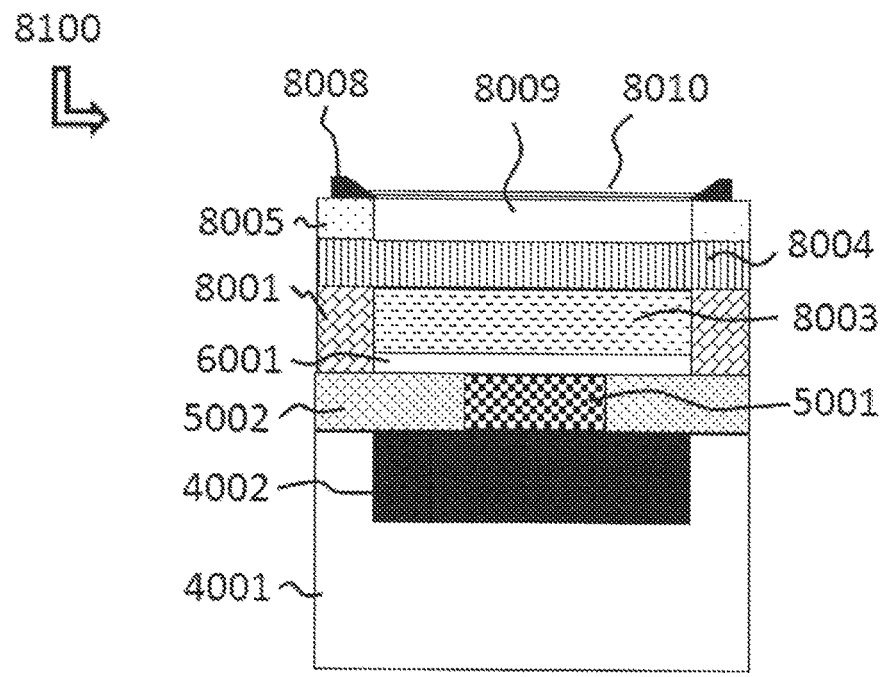

FIGS. 13A-13C are diagrammatic sketches of the pixel structure for a "stack" type of Cap-OLED display.

Figure 14:
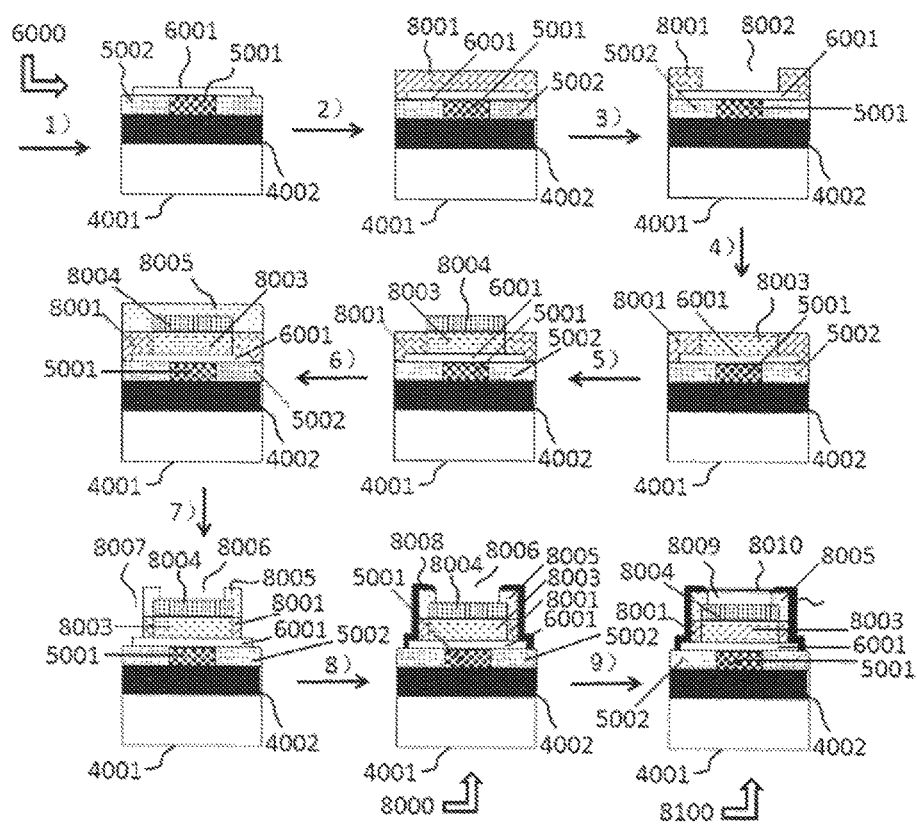

FIG. 14 schematically illustrates an exemplary method for producing a "stack" type of Cap-OLED display.

Figure 15:
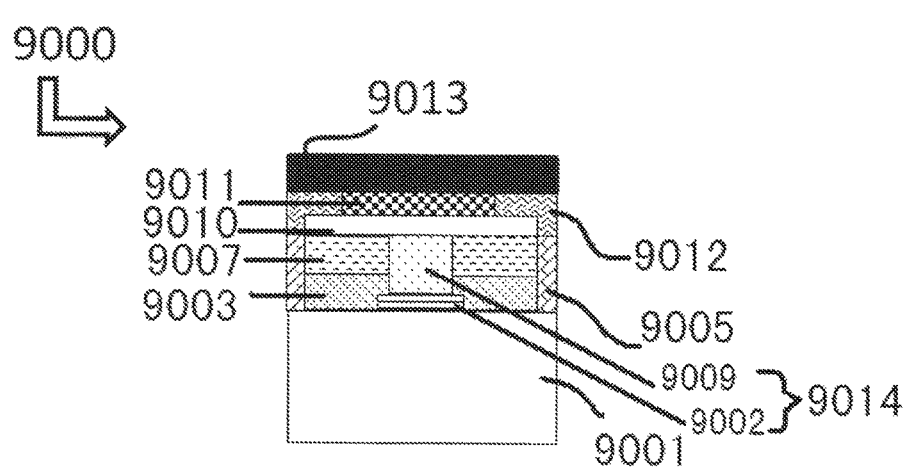

FIG. 15 illustrates the pixel structure for a "bottom-emitting" and "parallel" type of Cap-OLED display.

Figure 16:
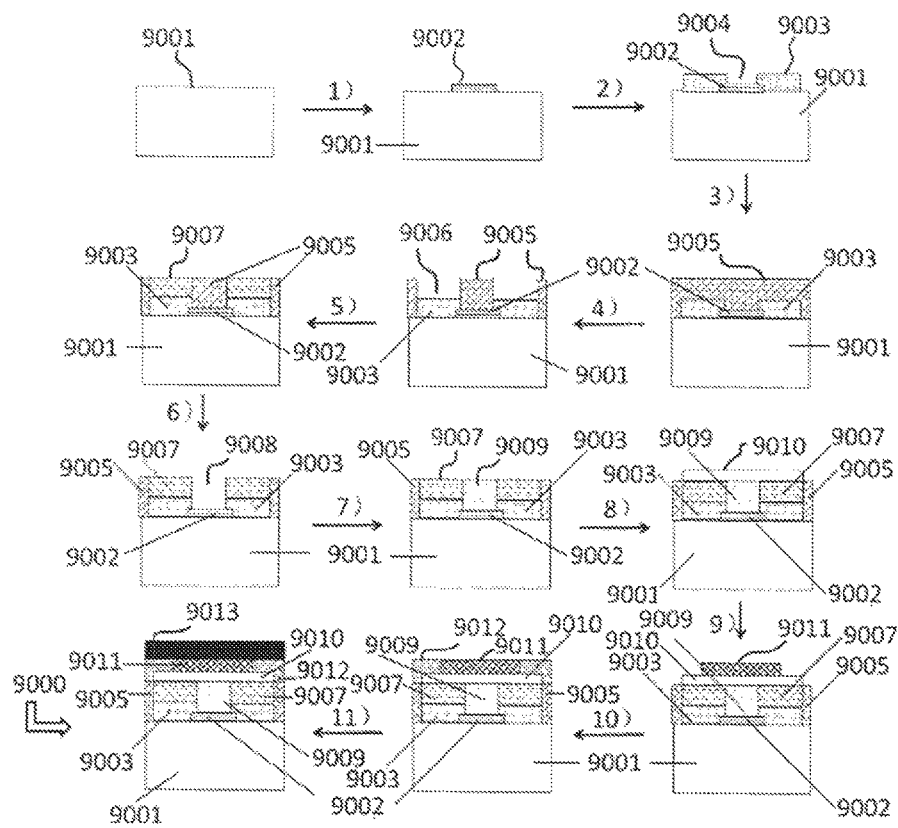

FIG. 16 schematically illustrates an exemplary method for producing a "bottom-emitting" and "parallel" type of Cap-OLED display.

Figure 17:
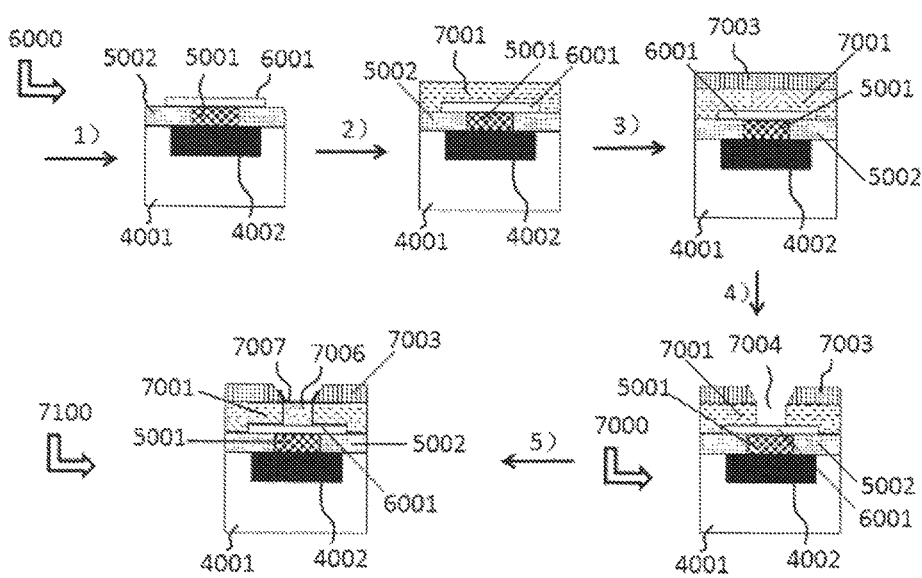

FIG. 17 schematically illustrates another exemplary method for producing a "parallel" type of Cap-OLED display.

Figure 18:
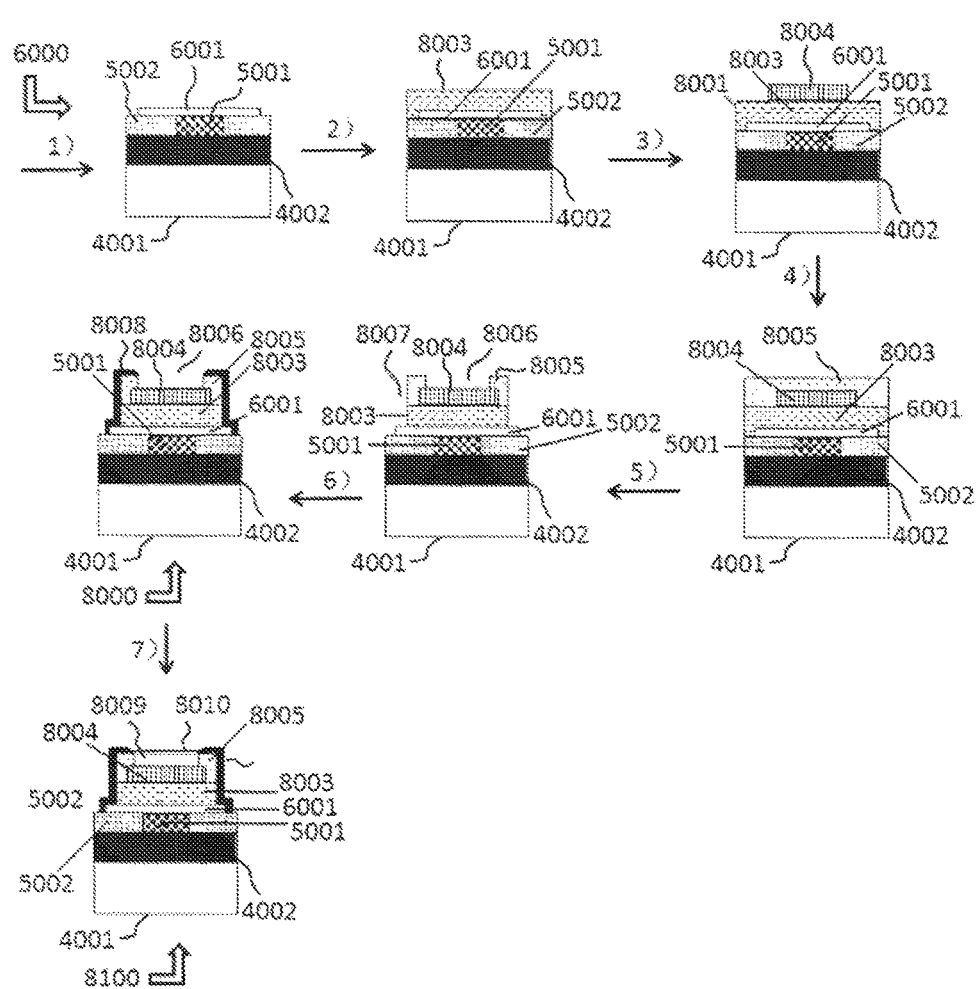

FIG. 18 schematically illustrates another exemplary method for producing a "stack" type of Cap-OLED display.

Figure 19:
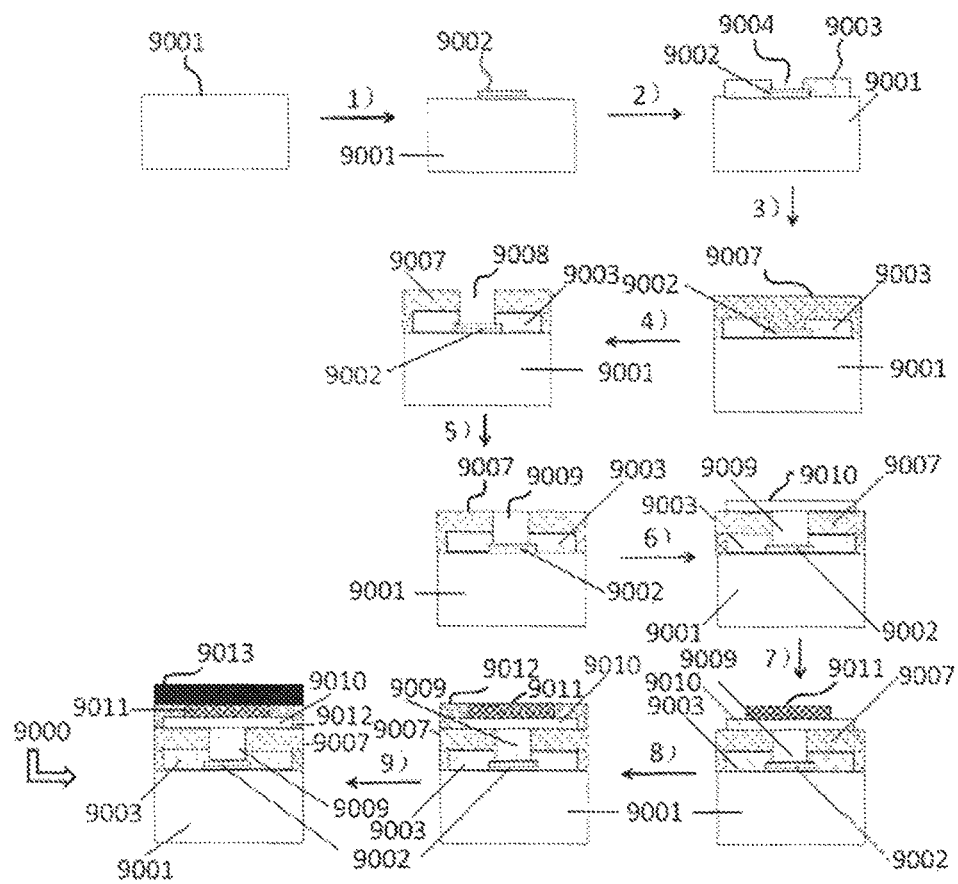

FIG. 19 schematically illustrates another exemplary method for producing a "bottom-emitting" and "parallel" type of Cap-OLED display.

DETAILED DESCRIPTION

The subject invention is applicable to all types of current-driven electroluminescent displays such as organic light emitting diode (OLED) displays, organic light emitting transistor (OLET) displays, and light emitting diode (LED) displays.

In the present embodiment, a capacitor-drive OLED (Cap-OLED) display is used as an example, with reference to the attached figures, to describe the capacitor-drive electroluminescent display.

A Cap-OLED uses the row and column electrode configuration similar to a PMOLED shown in FIG. 1A, wherein each crossing point of a row electrode and a column electrode contains a pixel. Its external driver circuitry also works in a line-by-line scanning manner similar to a PMOLED. However, it differs from PMOLED in that there is a capacitor-driver component introduced into each pixel to extend the light-emitting time. This pixel component includes a drive-capacitor, a charging switch, and an OLED device, wherein the drive-capacitor and the OLED device are electrically connected in parallel, and then electrically connected to the charging switch. Wherein, one end of the capacitor-drive component is electrically connected to the row electrode, and the other end to the column electrode; when the charging switch also involves a control end, the control end is usually electrically connected to the row electrode.

FIG. 3A is the schematic of a Cap-OLED circuitry. As can be seen with reference to FIG. 3A, the circuitry of a Cap-OLED includes row electrode 3001, column electrode 3002, OLED device 3003, drive-capacitor 3004, and charging switch 3005, wherein the drive-capacitor 3004 and the OLED device 3003 are connected in parallel, wherein one end of the charging switch 3005 is electrically connected to one end of the parallel-connected drive-capacitor 3004 and OLED device 3005, such that the charging switch 3005 is connected in series to the parallel-connected drive-capacitor 3004 and OLED device 3003, whereas the other end of the charging switch 3005 is connected to the row electrode 3001, whereas the other end of the parallel-connected drive-capacitor 3004 and OLED device 3003 is electrically connected to the column electrode 3002.

FIG. 3B is the schematic of another Cap-OLED circuitry. As can be seen with reference to FIG. 3B, the Cap-OLED circuitry also includes row electrode 3001, column electrode 3002, OLED device 3003, drive-capacitor 3004, and charging switch 3005, wherein the drive-capacitor 3004 and the OLED device 3003 are connected in parallel, wherein one end of the charging switch 3005 is electrically connected to one end of the parallel-connected drive-capacitor 3004 and OLED device 3005, such that the charging switch 3005 is connected in series to the parallel-connected drive-capacitor 3004 and OLED device 3003, whereas the other end of the charging switch 3005 is connected to the row electrode 3002, whereas the other end of the parallel-connected drive-capacitor 3004 and OLED device 3003 is electrically connected to the column electrode 3001.

It is to be understood that the meaning of the terminology "drive-capacitor" used in this document includes: (a) a single capacitor, and (b) a capacitor set consisting of multiple capacitors connected in parallel; the meaning of the terminology "charging switch" includes: (a) any electronic devices that have unidirectional conductivity, such as a diode, (b) an electronic switch consisting of multiple electronic components, and (c) electronically controlled micro mechanical switch.

The basic working principle of the Cap-OLED circuitry is: the charging switch 3005 is switched on as soon as the scanning voltage pulse arrives, which allows charging the drive-capacitor 3004 and at the same time switches on the OLED device 3003; at the end of the pulse, the charging switch 3005 is switched off automatically, and the drive-capacitor 3004 discharges via the OLED device 3003, keeping it remained lit until the voltage on capacitor 3004 is below the minimum turn-on voltage ($V_{on}$) of the OLED device. Clearly, the above Cap-OLED circuitry functions as an "energy storing and light-emitting time prolonging" circuitry.

In the above capacitor-driving mode, if row electrode 3001 is selected as the common electrode and as the zero-potential reference point, the apparent brightness of the pixel is determined by the capacitance of drive-capacitor 3004 and the peak voltage of the scanning voltage pulse (or the charged voltage of the drive-capacitor) applied to the column electrode 3002. The capacitance of the drive-capacitor 3004 can be adjusted according to the optoelectrical properties of the OLED device, such that the pixel stops emitting light before the arrival of the next pulse. Because the light-emitting time is extended, the OLED device 3003 (pixel) can work at a relatively lower initial brightness while still achieves a higher apparent brightness, therefore the lifetime and the electricity to light conversion efficiency of the OLED device 3003 are significantly improved.

The working principle of Cap-OLED in reference to PMOLED is further described below.

In the PM driving mode, the amount of light emitted by the OLED device within each scanning cycle (which is proportional to the apparent brightness) is determined by the area under the "brightness-time" curve—the larger the area, the more light is emitted and therefore the higher the apparent brightness. For a conventional PMOLED under an ideal situation (here and thereafter, an ideal situation refers to: the scanning pulse is rectangular, and the electricity to light conversion efficiency or the quantum efficiency of the OLED is constant, unless otherwise indicated), this area $L_o$ is the product of the pulse width $\Delta t_o$ and the pixel's transient brightness $B_P$ (refer to FIG. 3C), or $$L_0 = \Delta t_0 B_P = \Delta t_0 K \cdot I_P = K \cdot Q_0 \quad (2)$$

Where, $I_P$ is the current flowing through the OLED at brightness $B_P$; K is the electricity to light conversion efficiency of the OLED; and $\Delta t_0 \times I_P = Q_0$ is the amount of charge flew through the OLED.

For a Cap-OLED, the area under the "brightness-time" curve consists of two parts ($L_0 + L_C$, refer to FIG. 3C). Where, the first part $L_o$ is the same as that of a PMOLED, whereas the second part $L_C$ is proportional to the amount of charge ($Q_C$) that the capacitor discharged via the OLED, or $$L_C = \int B(t)dt = K \int I(t)dt = KQ_C = KC \times \Delta V = KC(V_P - V_{on}) \quad (3)$$

Where, B(t) is the OLED brightness as a function of time (t) during the capacitor discharging via the OLED; I(t) is the discharge current of the capacitor as a function of time; C is the capacitance of the capacitor; $V_{on}$ is minimum turn-on voltage of the OLED; $V_P$ is the height of the scanning voltage pulse (or the peak charged voltage of the capacitor). For easy comparisons, the "brightness-time" curves for both the PMOLED (the upper diagram in FIG. 3C) and the Cap-OLED (the lower diagram in FIG. 3C) are given in FIG. 3C.

It can be seen with reference to FIG. 3C and to the above analysis, the actual consequence of capacitor-driving is that the area under the "brightness-time" curve (or the apparent brightness) is enlarged from $L_o$ (equivalent to the amount of light produce by a regular PMOLED pixel) by the amount of $L_C$. Therefore, the effectiveness of capacitor-driving can be expressed as the enlargement magnitude of the apparent brightness, or $L_C/L_o$. From another point of view, if imagine $L_C$ to be a rectangle of the same area, in which its height is $B_P$ and its width is $\Delta t$ ($\Delta t = L_C/B_P$, refer to FIG. 3D), then the actual consequence of the capacitor-driving mode is equivalent to extending the pulse width of the PM-driving mode ($\Delta t_o$) by the amount of $\Delta t$. In other words, the advantage of capacitor-driving versus PM-driving can also been quantitatively characterized by the ratio of $\Delta t$ to $\Delta t_o$ ($\Delta t/\Delta t_o = L_C/L_o$): that is, the larger the value of $\Delta t/\Delta t_o$, the greater advantage of a Cap-OLED has over a PMOLED.

The following can be obtained from Equations 2 and 3:

$$\Delta t/\Delta t_0 = L_C/L_0 = C(V_P - V_{on})/\Delta t_0 I_P \quad (4)$$

Where, C is determined by the size, the material used, and the structure of the capacitor; $V_P$ and $I_P$ are related by a function characterized by the optoelectrical properties of the OLED; $V_{on}$ is a constant for devices of the same type (dependent of the optoelectrical properties of the OLED). $\Delta t_o$ is inversely proportional to the scan frequency z and the number of row electrodes n (refer to Equation 1). Therefore, when other parameters are kept constant, $\Delta t_o$ decreases as the number of row electrodes n increases (because $\Delta t_o \propto 1/n$), and thus $\Delta t/\Delta t_o$ increases as n increases (because $\Delta t/\Delta t_0 \propto n$). It can be seen from the above analysis that the advantage of Cap-OLED over PMOLED becomes greater as the size and resolution of the display increases (or n increases). In other words, Cap-OLED remedies PMOLED's shortage of unavailable for large panels.

Embodiment-1

The structure of a capacitor-drive electroluminescent display panel will be described below.

A capacitor-drive electroluminescent display includes a display substrate, row and column electrodes that are deposited on the display substrate, and an array of light-emitting pixels, wherein a light-emitting pixel includes an electroluminescent device, a drive-capacitor, and a charging switch. The row electrode, column electrode, electroluminescent device, drive-capacitor, and charging switch are connected in the following order: row (or column) electrode—charging switch—parallel-connected drive-capacitor and electroluminescent device—column (or row) electrode (refer to FIGS. 3A and 3B). The apparent brightness of a light-emitting pixel is controlled by the scan voltage applied between the row and column electrodes. Due to the existence of the drive-capacitor and the charging switch, pixel's light-emitting time is significantly longer than that in the absence of the drive capacitor and the charging switch.

The charging switch has two functions: first, as soon as the scanning pulse arrives it is switched on to allow the external circuitry charging the drive capacitor via the row and column electrodes, and at the same time to turn on the pixel; immediately after scanning pulse, the switch shuts off automatically to prevent the drive-capacitor from discharging via the external circuit—the capacitor is therefore forced to discharge via the OLED device.

The charging switch can be any electronic devices with unidirectional conductivity, for instance it can be one or multiple rectifier diodes, an electronic switching circuitry consisting of one or multiple diode(s) and/or transistor(s), or an electronically controlled micro mechanical switch.

Wherein, the electroluminescent device can be any devices that are capable of converting electrical current to light, such as LED, OLED, OLET, and so on.

In the following embodiments, OLED is used as an example to depict the specific structure of a capacitor-drive OLED (Cap-OLED) display and the method of producing the same. When the light-emitting device is an electroluminescent device other than an OLED, it is only necessary to have the elements corresponding to the OLED device modified accordingly, whereas everything else is similar to that of a Cap-OLED display.

FIG. 4 is the diagrammatic sketch for a Cap-OLED display using a "parallel" configuration. As shown in FIGS. 4a-c, the Cap-OLED display 7000 includes: the substrate 4001, the row electrode 4002, the charging switch 5001 (for instance, a rectifier diode), the first insulation layer (or insulating material) 5002, the middle electrode 6001, the dielectric layer of the drive-capacitor 7001 (constituting the drive-capacitor 3004 shown in FIGS. 3A and 3B), the second insulation layer (or insulating material) 7002, the column electrode 7003, and the OLED device 7008. Wherein, the charging switch 5001 mentioned here corresponds to the charging switch 3005 of FIGS. 3A and 3B; the drive-capacitor dielectric layer 7001 mentioned here corresponds to the drive-capacitor 3004 of FIGS. 3A and 3B; the OLED device 7008 mentioned here corresponds to the OLED device 3003 of FIGS. 3A and 3B.

FIG. 4a depicts the overall structure of the Cap-OLED display 7000 described above. As shown in FIG. 4a, on the substrate 4001 there are row electrodes 4002 arranged in parallel with a fixed spacing and column electrodes 7003 that are intersecting the row electrodes 4002. In the intersection of the row electrode 4002 and the column electrode 7003, there is the OLED device 7008. There are the first insulation layer 5002 and the second insulation layer 7002 in between the row electrode 4002 and column electrode 7003.

FIG. 4b is the cross sectional view of Cap-OLED display 7000 along the A-A line, whereas FIG. 4c is the cross sectional view of Cap-OLED display 7000 along the B-B line. As shown in FIGS. 4b and 4c, row electrodes 4002 are deposited on the substrate 4001 in parallel with a fixed spacing, and the charging switch 5001 is deposited on the row electrode 4002 at the position corresponding to the crossing point with a column electrode. The middle electrode 6001 is deposited on top of the charging switch 5001, and the OLED device 7008 and the drive-capacitor dielectric layer 7001 are deposited "side-by-side" on top of the middle electrode 6001, in which the middle electrode 6001 electrically connects the OLED device 7008 and the drive-capacitor dielectric layer 7001 in parallel. Wherein, a cavity 7004 (refer to FIG. 12) reserved for accommodating the OLED device 7008 is produced at the position corresponding to the crossing point of a row electrode 7003 and a column electrode 4002, and the charging switches 5001, middle electrodes 6001, drive-capacitor dielectric layers 7001, and OLED devices 7008, which are located at the crossing points of two neighboring column electrodes 7003 and row electrode 4002, are isolated by the first insulation layer 5002 and the second insulation layer 7002, respectively, and the display panel can be further packaged into the circuitry shown in either FIG. 3A or FIG. 3B.

Because both the resolution and physical dimension of a Cap-OLED are much greater than an ordinary PMOLED, it is expected that a Cap-OLED requires much higher driving current than a PMOLED. Therefore, the conductivity requirement on the row and column electrodes is also higher than that of a PMOLED. Wherein, since the row electrode is the common electrode that feeds all pixels in the same row at the same time (assuming the row-sweeping method), the current of the row electrode is higher than that of the column electrode. In order to reduce the power consumed by the row electrode, it is required to increase the thickness of the row electrode to reduce its resistance. Calculation shows that if aluminum is used as the row electrode, depending on the efficiency of the OLED device, the physical dimension and resolution of the display panel, the required thickness for the row electrodes may vary greatly ($10^0$-$10^3$ μm). Since this thickness is much greater than the thickness of a regular OLED (100-200 nm), it may be necessary to have the row electrodes embedded into the substrate to obtain a flat surface, so that the subsequent steps can be carry out smoothly.

FIG. 5 is an example of a substrate with "embedded" row electrodes. As shown in FIG. 5, in component 4000, the row electrodes 4002 are "inserted" into the substrate 4001, therefore a flat surface is obtained in component 4000.

FIG. 6 is an example of a substrate after deposition of the charging switches. As shown in FIG. 6, in component 5000, an array of the charging switches 5001 is deposited to the proper positions of the aforementioned component 4000, wherein the space between the neighboring charging switches 5001 are filled with the aforementioned first insulation layer 5002.

FIG. 7 is an example of a substrate after deposition of the middle electrodes. As shown in FIG. 7a, in component 6000, an array of the middle electrodes 6001 is deposited on the aforementioned component 5000 to the positions corresponding to the aforementioned charging switches 5001, wherein the middle electrodes 6001 are arranged in accordance with the charging switches 5001.

FIG. 7b is a cross sectional view of the aforementioned component 6000, as shown in FIG. 7a, along the A-A line. As shown in FIG. 7b, row electrodes 4002 are deposited on substrate 4001, and the upper surface of the row electrodes 4002 is flush with the upper surface of the substrate 4001. The charging switches 5001 are deposited on the row electrodes 4002, and the space between two neighboring charging switches 5001 is filled with the first insulating layer 5002. Preferably, the upper surface of the charging switches 5001 is flush with the upper surface of the first insulation layer 5002. The middle electrodes 6001 are deposited on top of the charging switches 5001.

As shown in FIG. 4, on each of the middle electrodes there are placed in parallel an aforementioned OLED device 7008 and the drive-capacitor dielectric layer 7001, and the second insulation layer 7002 is filled in between the neighboring OLED devices 7008 and the neighboring drive-capacitor dielectric layers 7001. Preferably, the upper surface of drive-capacitor dielectric layer 7001 is flush with the upper surface of the second insulation layer 7002. The column electrode 7003 is deposited over the second insulation layer 7002, the drive-capacitor dielectric layer 7001, and the OLED device 7008, wherein part of the OLED device 7008 protruding through the drive-capacitor dielectric layer 7001 is located in the aforementioned cavity 7004 of the column electrode.

The specific methods for producing a capacitor-drive display will be described below.

FIG. 8 illustrates an exemplary method for producing component 4000. As shown in FIG. 8, the method involves: 1) treat the substrate 4001 to obtain a flat and smooth surface; 2) etch the flat and smooth surface of substrate 4001 to produce a set of parallel ditches 4003 with fixed spacing, where ditches 4003 are prepared for accommodating the row electrodes; 3) then fill the ditches 4003 with electrode materials to form row electrodes 4002, and preferably, the electrode material is a metallic material; 4) planarize and polish the surface of substrate 4001 bearing the row electrode material to give component 4000.

FIG. 9 illustrates another exemplary method for producing component 4000. As shown in FIG. 9, the method involves: 1) treat the substrate 4001 to obtain a flat and smooth surface; 2) coat the flat and smooth surface of substrate 4001 with a metal layer 4004; 3) etch the metal layer 4004 to form a set of row electrodes 4002 that are aligned in parallel in a fixed spacing; 4) planarize the surface of substrate 4001 bearing the row electrodes 4002, preferably, by filling the gaps between neighboring row electrodes with insulation material 4005 followed by polishing to obtain a flat and smooth surface, to give component 4000.

FIG. 10 illustrates another exemplary method for producing component 4000. In the cases that the substrate 4001 consists of a thermoplastic substance or the surface of substrate 4001 contains a layer of a thermoplastic substance, component 4000 can be produced using the method illustrated in FIG. 10. Specifically, the method involves: 1) heat the surface of substrate 4001 to soften at least the thermoplastic material on the surface to the degree that will allow inserting the row electrodes 4002 into the surface under a pressure; 2) impress the row electrodes 4002 into the thermally softened surface of substrate 4001 in a parallel manner with a fixed spacing; 3) cool the surface of substrate 4001 with row electrodes 4002 inserted; 4) after the substrate 4001 bearing the inserted row electrodes 4002 is cooled down, planarize the surface of 4001 to give component 4000.

In the embodiments set forth above, the material used for the row electrode 4002 is selected based on the processing temperature and the conductivity requirement of the display panel, and a variety of metallic materials, such as copper, aluminum, iron, nickel, tungsten, chromium, gold, platinum, etc., and their alloys, can be used for the row electrode 4002 to meet different needs. When it becomes necessary, a combination of multilayer of different metals can be used to meet some special requirements. For instance, coating a thin layer of gold or platinum on top of an electrode that is easily subject to oxidation can prevent the electrode from being oxidized and losing conductivity.

The charging switch 3005 may be produced directly on the surface of component 4000, or a finished charging switch 3005 can be transplanted to the surface of component 4000. For instance, if a rectifier diode is used as the charging switch 3005, the diode can be produced directly on the surface of component 4000 using standard semiconductor processes, or the diodes can be produced on a silicon wafer, diced, then pasted onto the surface of component 4000 at the relevant positions, and then the surface is planarized again to give component 5000.

FIG. 11 illustrates an exemplary method for producing component 5000. As shown in FIG. 11, the method involves: 1) deposit an array of charging switches 5001 on the row electrodes 4002 of component 4000; 2) planarize the component 4000 bearing an array of the charging switches 5001, preferably, by filling the gaps between the charging switches 5001 with insulation material 5002 (the first insulation layer), followed by polishing to give component 5000 (refer to FIG. 6).

In the embodiments described above, it is also applicable to deposit the first insulation layer 5002 on the row electrodes 4002 of component 4000 first, then etch the first insulation layer 5002 at the positions corresponding to the row electrodes 4002 to produce an array of cavities that are prepared for accommodating the charging switches 5001, then the charging switches 5001 are deposited into the cavities to give component 5000 that is bearing an array of the charging switches 5001.

Then, on top of the charging switch 5001 array of component 5000, an array of the middle electrodes 6001 is deposited such that the bottom of the charging switch 5001 is electrically connected to the row electrode 4002, and the top of the charging switch 5001 is electrically connected to the middle electrode 6001, which is electrically connected to the aforementioned OLED device 3003 and drive-capacitor 3004 (refer to FIGS. 4 and 7).

Preferably, the above middle electrode 6001 array can be produced by physical vapor deposition (PVD) of a metal thin film followed by a photolithography process to etch out the desired pattern. If high precision is not required, other printing methods such as screen printing or vacuum evaporation via a shadow mask can also be used.

Preferably, the area of the middle electrode 6001 is roughly equal to the maximum usable pixel area, in which its length and width are roughly equal to or slightly larger than the width of the row and column electrode, respectively. Shown in FIG. 7 is a three dimensional look of component 6000 and a cross sectional view at the position corresponding to a pixel.

Although the aforementioned drive-capacitor 3004 and OLED device 3003 above the middle electrode 6001 are electrically connected in parallel (refer to FIGS. 3A and 3B), they can be spatially arranged in either a "parallel" manner (the drive-capacitor and the OLED device are on the same plane) or a "stack" manner (the OLED device is above the drive-capacitor). The "parallel" configuration has the advantage of less fabrication steps. The disadvantage is that since the drive-capacitor and the OLED device are in the same plane the area available for the OLED device (or the light-emitting area for the pixel) is reduced. Suppose A is the maximum available pixel area (A roughly equals to the overlapping area of a row and a column electrode) and $A_C$ is the area of the drive-capacitor, then the area of the OLED will be $A_O = A - A_C < A$ (because $A = A_O + A_C$). Therefore the amount of light produced is less if compared to a device of area A. However, in consideration of the fact that the transparent electrode of the OLED device in a Cap-OLED can be made very thin (see more detailed discussion below) and therefore may enhance the light out-coupling efficiency, which may in certain extent remedy the loss due to the reduced light-emitting area. Therefore, when the OLED device has relatively high efficiency and brightness the "parallel" configuration can be selected.

FIG. 12 illustrates an exemplary method for producing a "parallel" type of Cap-OLED display. As shown in FIG. 12, the method for producing a "parallel" type of Cap-OLED display mainly involves the following steps:

1) Obtain component 6000 (procedure for producing component 6000 is as set forth above, it is not to be repeated herein);

2) Deposit the second insulation layer 7002 on component 6000;

3) Etch the second insulation layer 7002 at the position corresponding to the middle electrode 6001 to produce cavity 7005, which is prepared for accommodating capacitor dielectric material 7001 (or the dielectric layer constituting the drive-capacitor), wherein the cavity 7005 shapes like a rectangular "moat" (referred as the "moat-shaped" herein after) with a rectangular post of 7002 remained in the center of cavity 7005 (the "moat"); wherein, the remaining post of 7002 in the cavity center, which will be removed in the subsequent steps, is the space reserved for the OLED device 7008;

4) Fill the "moat-shaped" cavity 7005 with the capacitor dielectric material 7001;

5) Deposit column electrodes 7003, preferably, in accordance with each column of middle electrodes 6001 in the middle electrode 6001 array, accordingly the column electrodes 7003 are laid parallel with a fixed spacing, and the row and column electrodes appear intersecting each other if viewing over the device surface plane;

6) Etch cavity 7004 that is prepared for accommodating the OLED device, preferably, etch in the position corresponding to the aforementioned post of the second insulation layer 7002 remaining in the center of the "moat" to produce cavity 7004 that is prepared for accommodating the OLED device, and the post of the second insulation layer 7002 remaining in the center of the "moat" is completely removed by etching cavity 7004 that is prepared for accommodating the OLED device.

7) Deposit the organic layer 7006 (the main part of OLED device 7008) into cavity 7004, and deposit a transparent electrode 7007, which is electrically connected to the column electrode 7003, on top of the organic layer 7006 to give the OLED device 7008. Wherein, the transparent electrode 7007 is slightly larger than cavity 7004 to insure that the transparent electrode 7007 is electrically connected to the column electrode 7003.

In the above embodiments, the process used to form the capacitor dielectric layer 7001 and the second insulation layer 7002 may vary according to the material(s) selected. For instance, if a ceramic material is selected, sputtering, physical vapor deposition (PVD), chemical vapor deposition (CVD), atomic layer deposition (ALD), etc., may be suitable; for polymeric materials, spin coating, doctor blade coating, spray coating, etc., may be suitable. It is to be noted that the aforementioned order of producing the capacitor dielectric layer 7001 and the second insulation layer 7002 can be reversed: that is, first, depositing the capacitor dielectric layer 7001 on the middle electrode 6001, then planarizing the surface with the second insulation layer 7002. The specific method includes (but not limit to), for instance, first depositing the dielectric layer 7001 on the surface of component 6000 using a plasma-enhanced chemical vapor deposition (PECVD) or ALD process; then forming the capacitor array using a photolithography process; and finally, using a spin-on glass material as the 7002 layer to planarize the surface.

In the above embodiments, the procedure for producing the column electrodes 7003 may involve depositing a metal film using a sputter-deposition process followed by etching the metal film into the column electrode lines using a photolithography process.

In the above embodiments, the procedure for forming cavity 7004, which is prepared for accommodating the OLED device, can be further divided into two steps: first, etch the column electrode 7003 at the position corresponding to the OLED device 7008, to open a window to the dielectric/insulation layer or the light-emitting window of the OLED device 7008 on the column electrode 7003 (or the upper part of cavity 7004), then the remaining 7002 below can be removed via this window.

In the above embodiments, the procedure for forming the column electrodes 7003 may involve depositing a metal film using a sputter-deposition process, then carrying on the procedure of etching the cavity 7004 that is prepared for accommodating the OLED device 7008, then etching out the column electrode lines using a photolithography process.

In the above embodiments, the last step in the method of producing the Cap-OLED display is to generate the OLED device 7008, which includes depositing the organic layer, depositing the transparent electrode, and packaging the device. Since these processes are the same as those used for a conventional OLED display, the details are not described herein. It is to noted that, in this embodiment, the organic layer 7006 generally consists multiple layers of organic materials with different functionalities; the transparent electrode 7007 on top of the OLED device 7008 can be any transparent conductive materials, such as carbon nanotube, graphene, transparent metal oxide, or an ultrathin layer of metal, for instance a layer of gold, silver, copper, aluminum, magnesium, lithium, or the combination of them, with a thickness of 1-5 nm.

In the above embodiments, since ever individual pixel in a Cap-OLED display has a dedicated transparent electrode 7007, the electrical current that passes the transparent electrode 7007 is what needed by a single pixel, which is usually very small (in the order of micro ampere level). Therefore, the transparent electrode 7007 in a Cap-OLED display may have higher resistance. As a result, the transparent electrode 7007 can be made much thinner than 100-200 nm that is generally required by a conventional OLED. If a highly conductive metal, such as aluminum, silver, gold, etc., is used for 7007, the electrode thickness required will not exceed one nanometer. Therefore, the transparency of the transparent electrode 7007 of the subject invention is higher than that of the conventional AMOLED or PMOLED. Additionally, the light-extraction efficiency can be further enhanced by optimizing the geometry of the device and using optical effects. Therefore, the amount of light lost due to reduced device area is made up in certain extent due to improvement in the light-extraction efficiency.

On the other hand, since the TFT driver circuitry in an AMOLED also occupies some space, the effective light-emitting area of an AMOLED is generally 50%-70% of the panel surface area. In the above embodiments, after taking into account of all the above factors, the area of an OLED device 7008 $A_o$ in a "parallel" Cap-OLED display can be in the range of A/4 to A/2.

In the above embodiments, although, as shown in FIGS. 4 and 12, the drive-capacitor dielectric layer 7001 and the OLED device 7008 are arranged in a rectangular "moat-shape", where the OLED device 7008 is located in the center and is surrounded by the drive-capacitor dielectric layer 7001, it is to be noted that the subject invention is not limited by this configuration. The drive-capacitor dielectric layer 7001 and the OLED device 7008 can also be arranged in other ways, such as in a "side by side" way (i.e., the drive-capacitor dielectric layer 7001 on the left side and the OLED device 7008 on the right side, or vice versa); or the OLED device 7008 resides in the middle and the drive-capacitor dielectric layer 7001 is split into two halves, residing on the left and right sides of 7008, respectively.

In the above embodiments, the thickness of the organic layer 7006 of OLED device 7008 roughly equals the thickness of the drive-capacitor dielectric layer 7001.

In the above embodiments, both the resolution and the physical dimension of a Cap-OLED display are much greater than those of an ordinary PMOLED, therefore the drive current is also significantly greater than that of a PMOLED. Accordingly, the conductivity requirement on the row and column electrodes is also higher than that of a PMOLED. Wherein, since the row electrode is the common electrode that feeds all pixels of the same row at the same time (assuming row-to-row sweeping mode), the current of the row electrode is higher than that of the column electrode. In order to reduce the power consumption by the row electrode, it is necessary to reduce the electrode resistance by increasing the electrode thickness. If aluminum is used for the row electrode, depending on the efficiency of the OLED device, the physical dimension, and the resolution of the display panel, the thickness of the row electrode may vary greatly from $10^0$ to $10^3$ micrometer, which is significantly greater than the thickness of an ordinary OLED device (100-200 nm), this problem can be resolved by embedding the row electrodes into the substrate to obtain a flat surface.

Examples:

Deposit the row electrode metal film 4004 on the substrate 4001 by sputter deposition, then spin-coat a photoresist on the top of the row electrode metal film 4004. Row electrode 4002 (refer to FIG. 9) is obtained after executing a series of procedures, such as drying, exposure, development, etching, etc. In this example, these steps are collectively called a photolithography process. Subsequently, use the Doctor Blade Coating technique to coat a spin-on glass material (or insulation material 4005). Remove the spin-on glass material on the surface of the row electrode 4002 using a reactive ion etching (RIE) process to give component 4000.

Use a plasma enhanced chemical vapor deposition (PECVD), or atomic layer deposition (ALD), or other thin film deposition process to deposit a layer of N-type semiconductor, a layer of P-type semiconductor, and a metal protective layer (for example, a chromium layer of 50-100 nm thick) on component 4000 in sequence. Then, use a photolithography process to remove the metal protective layer and the semiconductor layers beyond the area corresponding to the charging switches to give an array of diodes (or the charging switch 5001, refer to FIG. 11) that are attached to the row electrodes 4002 (the chromium protective layer is not shown in FIG. 11). Subsequently, coat a layer of spin-on glass material (or the first insulation layer 5002) using the spin-coating process (or Doctor Blade Coating technique) to fill the gaps between the diodes 5001. Finally, remove any residual spin-on glass material 5002 from the protective metal layer on top of diode 5001 using a RIE process to give component 5000.

Use a sputter deposition process to deposit on component 5000 a layer of high work-function metal, such as 100-200 nm of tungsten, nickel, chromium, gold, or their alloy, then form the middle electrode array 6001 using a photolithography process (refer to FIG. 7, component 6000).

Deposit a silicon dioxide ($SiO_2$) film of 200 nm thick (the second insulation layer 7002) onto component 6000 using a PECVD process. Then, etch the silicon dioxide layer 7002 at positions corresponding to the middle electrodes using a photolithography process to generate an array of the "moat-shaped" cavity 7005 that is prepared for accommodating the drive-capacitor dielectric layer, where the silicon dioxide layer left in the center of cavity 7005 is the space reserved for the OLED device 7008. In a "parallel" type of Cap-OLED display, the $SiO_2$ layer 7002 and the organic layer 7006 have approximately the same thickness.

Subsequently, a paste material containing $BaTiO_3$ (or the drive-capacitor dielectric material 7001) is filled into the "moat-shaped" cavity 7005 using a screen printing or doctor blade coating process. Slight dry; then polish the surface; then fully dry.

Deposit the column electrode metal film (for example, 100 nm of chromium) using a sputter deposition process, followed by a photolithography process to form the column electrode 7003; repeat another photolithography procedure on the column electrode 7003 to produce the light-emitting window for the OLED device 7008 (or the upper part of cavity 7004, refer to FIG. 12) at the position corresponding to the organic layer 7006 (or the $SiO_2$ post in the center of the drive-capacitor); subsequently, remove the $SiO_2$ post remaining in the lower part of cavity 7004 using a chemical etching process to give component 7000.

The last step for forming the OLED device 7008 is the same as those used in a conventional "top-emitting" OLED device, except for the transparent electrode 7007. For instance, for small molecular OLEDs, the organic materials can be deposited into the cavity 7004 by vacuum evaporation via a shadow mask; for polymeric materials, ink-jet printing can be used.

The transparent electrode on top of the OLED device can be deposited on the organic layer 7006 and on part of the column electrode 7003 via another shadow mask. The material used for the transparent electrode 7007 of OLED device 7008 is selected based on the properties of the OLED materials. Common OLED cathodes such as LiF/Al, Mg/Ag, and Li/Al, can be used if the electrode is thin enough, for instance, no more than 10 nm, no more than 5 nm, or in the range of 1-2 nm, to transmit light.

Embodiment-2

When it is necessary to increase the area for both the OLED device and the drive-capacitor, a "stack" configuration, or the OLED device resides on top of the drive-capacitor, can be used. The method for forming component 6000 is the same as that described above in the Method of Implementation (1), therefore is not to be repeated herein.

FIGS. 13A-13C illustrate the structure of a single pixel in a "stack" type of Cap-OLED display. Shown in FIG. 13A is the three dimensional structure of a single pixel (component 8000) before the OLED device is deposited; shown in FIG. 13B is a cross sectional view of a single pixel bearing the OLED device (component 8100) along the middle of the row electrode; shown in FIG. 13C is a cross sectional view of a single pixel bearing the OLED device (component 8100) along the middle of the column electrode.

As can be seen with reference to FIGS. 13A-13C, the capacitor-drive OLED display includes: the substrate 4001, the row electrode 4002, the charging switch 5001 (for instance, a rectifier diode), the first insulation layer 5002, the middle electrode 6001, the drive-capacitor dielectric layer 8003 (constituting the drive-capacitor 3004 of FIGS. 3A and 3B), the second insulation layer 8001, the column electrode 8004, the third insulation layer (insulation material) 8005, the auxiliary electrode 8008, the organic layer 8009, and the transparent electrode 8010 (the organic layer 8009 and the transparent electrode 8010, together, form the OLED device corresponding to device 3003 of FIGS. 3A and 3B).

Wherein, the row electrodes 4002 are arranged in parallel with a fixed spacing, and the row electrodes 4002 are "inserted" into the substrate 4001, so that the upper surface of the row electrode 4002 is flush with the upper surface of the substrate 4001 and therefore a flat and smooth surface is obtained. The charging switches 5001 are deposited onto the row electrodes 4002 in a predefined array, and the gaps between the neighboring charging switches are filled with the first insulation layer 5002 (refer to FIG. 6). The middle electrodes 6001 are deposited on top of the charging switches 5001, forming an array of the middle electrodes 6001 (refer to FIG. 7); then the drive-capacitor dielectric layer 8003 is deposited on the individual middle electrode 6001, and the neighboring middle electrodes 6001 as well as the neighboring drive-capacitor dielectric layer 8003 are isolated by the second insulation layer 8001. Column electrodes 8004 are deposited on top of the drive-capacitor dielectric layer 8003, which are arranged in accordance with the array of the drive-capacitor dielectric layer 8003 in the column direction perpendicular to the row electrodes 4002. The OLED device consisting of the organic layer 8009 and the transparent electrode 8010 is deposited in accordance with the drive-capacitor 8003 on the opposite side of the column electrode 8004, wherein the neighboring column electrodes 8004 as well as the neighboring OLED devices are isolated by the third insulation layer 8005. The transparent electrode 8010 is electrically connected to the middle electrode 6001 via the auxiliary electrode 8008.

FIG. 14 schematically illustrates an exemplary method for producing a "stack" type of Cap-OLED display. As shown in FIG. 14, the method for producing a "stack" type of Cap-OLED display involves the following procedures:

1) Obtain component 6000 (procedure for producing component 6000 is as set forth above, it is not to be repeated herein);

2) Deposit the second insulation layer 8001 on component 6000;

3) Etch the second insulation layer 8001 in the area corresponding to the middle electrode 6001 to form cavity 8002, which is prepared for containing the capacitor dielectric material 8003 (or the dielectric layer constituting the drive-capacitor);

4) Fill the cavity 8002 with capacitor dielectric material 8003;

5) Deposit column electrodes 8004, preferably, deposit column electrode 8004 in accordance with the middle electrode array in the column direction, accordingly the column electrodes 8004 are laid parallel with a fixed spacing, and the row and column electrodes appear intersecting each other if viewing over the device surface plane;

6) Deposit the third insulation layer 8005, preferably, the third insulation layer 8005 completely covers the surface bearing the column electrodes 8004;

7) Etch the third insulation layer 8005 to create i) the cavity 8006 that is prepared for containing the OLED device 3003, and ii) the passage 8007 that will allow the auxiliary electrode 8008 to reach the middle electrode 6001, wherein there are multiple passages 7008 arranged around each pixel, preferably, two passages 8007, one on each side, for each pixel;

8) Deposit the auxiliary electrode 8008 into passage 8007, wherein the number of auxiliary electrodes 8008 equals the number of the passages 8007;

9) Deposit the organic layer 8009 into cavity 8006, and deposit the transparent electrode 8010, which is electrically connected to the auxiliary electrode 8008, on top of the organic layer 8009 to form the OLED device 3003. Wherein, the transparent electrode 8010 is slightly larger than the cavity 8006 to insure that the transparent electrode 8010 is electrically connected to the auxiliary electrode 8008.

In the above procedure, Steps 1-4, which form the drive-capacitor, are similar to that of the "parallel" type of Cap-OLED. Steps 5-9 form the OLED device 3003. Since the OLED device 3003 is located above the column electrode 8004, an auxiliary electrode 8008 is required to electrically connect the transparent electrode 8010 located on top of the organic layer 8009 to the middle electrode 6001 underneath the drive-capacitor (drive-capacitor dielectric layer 8003). Therefore, after Step 6 of depositing the third insulation layer 8005, it is necessary to open the passage 8007 leading to the middle electrode 6001 while etching the cavity 8006 for the organic layer 8009 (Step 7). Step 9 is the same as what used for production of conventional OLEDs, therefore will not be described in details herein. Furthermore, other relevant processes are the same as those described in the Embodiment-1.

In the above embodiments, the process used to form the capacitor dielectric layer 8003 and the second insulation layer 8001 may vary according to the material(s) selected. For instance, if a ceramic material is selected, sputtering, physical vapor deposition (PVD), chemical vapor deposition (CVD), atomic layer deposition (ALD), etc., may be suitable; for polymeric materials, spin-coating, doctor blade coating, spray coating, etc., may be suitable. It is to be noted that the aforementioned order of producing the capacitor dielectric layer 8003 and the second insulation layer 8001 can be reversed: that is, first, depositing the capacitor dielectric layer 8003 on the middle electrode 6001, then planarizing the surface with the second insulation layer 8001. The specific method includes (but not limit to), for instance, first depositing the dielectric layer 8003 on the surface of component 6000 using a plasma-enhanced chemical vapor deposition (PECVD) or ALD process; then forming the capacitor array using a photolithography process; and finally, using a spin-on glass material as the 8003 layer to planarize the surface.

Embodiment-3

Although in the above embodiments a "top-emitting" configuration (the front side of the display is the upper side of the substrate), a Cap-OLED display can also use a "bottom-emitting" configuration (the front side of the display is the bottom side of the substrate).

Shown in FIG. 15 is the structure of a single pixel for a Cap-OLED display using a "bottom-emitting" and "parallel" configuration.

In the "bottom-emitting" and "parallel" type of Cap-OLED display, all pixels are allocated in a predetermined array.

As shown in FIG. 15, Cap-OLED display 9000 includes a transparent substrate 9001, column electrode 9003, the first insulation layer (insulation material) 9005, the drive-capacitor dielectric layer 9007 (constituting the drive capacitor 3004 shown in FIGS. 3A and 3B), the middle electrode 9010, the charging switch 9011 (a rectifier diode, for instance), the second insulation layer (insulation material) 9012, the row electrode 9013, and the OLED device 9014 (corresponding to the OLED device 3003 shown in FIGS. 3A and 3B). Wherein, on the substrate 9001 there are the column electrodes 9003 laid in parallel with a fixed spacing, and the row electrodes 9013 laid crossing the column electrodes 9003. At the crossing point of a row and a column electrode there is an OLED device 9014.

More specifically, as shown in FIG. 15, the OLED device 9014 includes a transparent electrode 9002 and the organic layer 9009, wherein the transparent electrode 9002 can be deposited directly on the transparent substrate 9001, and the OLED devices 9014 are deposited on the substrate according to a predefined array. One end of the OLED device 9014 that contains the transparent electrode 9002 is inserted into the column electrode 9003, such that the column electrode 9003 is electrically connected to the OLED device 9014. The organic layer 9009 of the OLED device 9014 above the column electrode 9003 is surrounded by the drive-capacitor dielectric layer 9007. The gaps between the neighboring column electrodes 9003, between the neighboring OLED devices 9014 of the individual pixels, and between the neighboring drive-capacitor dielectric layers 9007 of the individual pixels, are filled with the first insulation layer 9005. The middle electrode 9010 is deposited on top of the drive-capacitor dielectric layer 9007 and the organic layer 9009, and the charging switch 9011 is deposited on the middle electrode 9010. Row electrodes are deposited on top of the charging switches 9011. Wherein, the gaps between the neighboring middle electrodes 9010 of the individual pixels and between the neighboring charging switches 9011 of the individual pixels are filled with the second insulation layer 9012.

The pixel components of the above Cap-OLED display 9000 can be packaged into the circuitry illustrated in either FIG. 3A or FIG. 3B.

The method for producing a "bottom-emitting" and "parallel" type of Cap-OLED display is described below.

FIG. 16 illustrates an exemplary method for producing a "bottom-emitting" and "parallel" type of Cap-OLED display. As shown in FIG. 16, the method for producing the "bottom-emitting" and "parallel" type of Cap-OLED display involves:

1) Deposit the transparent electrode 9002 onto the transparent substrate 9001 according to a predetermined array;

2) Deposit the column electrode 9003 on the transparent substrate 9001 in accordance with the transparent electrodes 9002, and etch the column electrode 9003 at the position corresponding to the transparent electrode 9002 to produce the light-emitting window 9004 for the OLED;

3) Deposit the first insulation layer 9005 on the transparent substrate 9001 bearing the light-emitting windows 9004, such that the first insulation layer 9005 covers the column electrode 9003, the gaps in between, as well as the light-emitting window 9004;

4) Etch the first insulation layer 9005 at the area corresponding to the column electrode 9003 around the light-emitting window 9004 to produce the cavity 9006 that is prepared for containing the drive-capacitor dielectric layer 9007. Wherein, the size of cavity 9006 corresponds to that of the middle electrode 9010. Preferably, the middle electrode 9010 covers both the cavity 9006 and the light-emitting window 9004;

5) Fill cavity 9006 with the drive-capacitor dielectric material 9007, such that the drive-capacitor dielectric material 9007 is on the column electrode 9003 and in contact with the column electrode 9003;

6) Remove the first insulation material 9005 remained in the light-emitting window 9004 to form cavity 9008, which is prepared for accepting the organic layer 9009 of the OLED device;

7) Deposit the OLED's organic layer 9009 into cavity 9008, so that the organic layer 9009 is deposited on the transparent electrode 9002, forming the OLED device 9014;

8) Deposit the middle electrode 9010 on the drive-capacitor dielectric layer 9007 and the organic layer 9009. The middle electrode 9010 is also the cathode for the OLED device 9014;

9) Deposit the charging switch 9011 on the middle electrode 9010;

10) Deposit the second insulation layer 9012 onto the transparent substrate 9001 bearing the charging switches 9011, such that the second insulation layer 9012 fills in between the neighboring middle electrodes 9010 of the individual pixel and the neighboring charging switches 9011. Wherein, the upper surface of 9011 is not covered by the second insulation layer 9012;

11) Deposit row electrodes 9013 onto the charging switches 9011 in accordance with the rows of the array of the charging switches 9011.

In the above embodiments, a sputter-deposition process may be used to deposit 20 nm of ITO (the transparent electrode 9002) and 100 nm of tungsten metal, followed by two photolithography steps to form the column electrode lines 9003 and the light-emitting windows 9004.

In the above embodiments, a vacuum evaporation process via a shadow-mask may be used to deposit the organic layer and the cathode of a tandem OLED into cavity 9008. Wherein, the cathode of the OLED may use the popular combination of LiF/Al, Mg/Ag, Li/Al; and yet it is required that the total thickness of the tandem OLED equals roughly the depth of cavity 9008. Preferably, the depth of cavity 9008 is sufficient to accommodate a stack of 3-4 OLEDs.

In the above embodiments, a shadow-mask slightly larger than the area of the OLED device may be used to deposit a metallic protection layer, for example 100 nm of aluminum, on top of the cathode; then, sputter deposition of 300 nm of tungsten, followed by a photolithography process to form the middle electrode 9010.

In the above embodiments, the charging switches 9011 may use diodes produced in a silicon wafer, which are diced and pasted onto the middle electrodes; then carry on a planarization process using a spin-on glass material, and finally deposit the row electrodes 9013. The charging switch 9011 may also be produced directly on the middle electrode. For example, if a rectifier diode is used as the charging switch, the diode can be produced directly on the middle electrodes using standard semiconductor production processes.

In the above embodiments, the size (length and width) of the transparent electrode 9002 may be smaller than the column electrode 9003, but must be larger than the light-emitting window 9004 to insure there is enough overlapping area between the transparent electrode 9002 and the column electrode 9003.

In the above embodiments, it is recorded that the first insulation layer 9005 is deposited first, then the drive-capacitor dielectric layer 9007 is deposited. However, the subject invention is not limited by this, and the sequence of depositing the first insulation layer 9005 and the drive-capacitor dielectric layer 9007 may also be reversed, that is, deposit the drive-capacitor dielectric layer 9007 first, then deposit the first insulation layer 9005. Specifically, deposit the drive-capacitor dielectric layer 9007 on the transparent substrate 9001 bearing the column electrode 9003 with the OLED light-emitting window 9004 etched at the position corresponding to the transparent electrode 9002, and etch out an array of the drive-capacitor, then use the first insulation layer material 9005 to planarize the transparent substrate 9001 bearing the drive-capacitor array, then etch the transparent substrate 9001 that has been planarized with the first insulation layer 9005 at the position corresponding to the OLED light emitting window 9004 to form the cavity 9008 that is prepared for containing the organic layer 9009 of the OLED device.

In the above embodiments, since the depth of cavity 9008 is expected to be greater than the thickness of a regular OLED, therefore this structure is suitable for tandem OLED.

In the above embodiments, it is recorded that the charging switch 9011 is deposited first, and then the second insulation layer 9012 is deposited. However, the subject invention is not limited by this, and the sequence of depositing the charging switch 9011 and the second insulation layer 9012 can be reversed, that is, deposit the second insulation layer 9012 first, and etch the second insulation layer 9012 to generate a cavity for containing the charging switch 9011, then fill the cavity with the premanufactured charging switch 9011. Specifically, deposit the second insulation layer 9012 onto the transparent substrate 9001 bearing the middle electrode 9010, and etch a cavity for containing the charging switch 9011 at the position corresponding to the middle electrode 9010, then deposit the charging switch 9011 into the cavity.

Furthermore, other relevant processes of the above embodiments are the same as those described in Embodiment-1.

The advantage of using the "bottom-emitting" configuration is that the OLED hermetic sealing step may be eliminated. This is because that starting from Step 8, every subsequent step functions as a hermetic sealing layer for the OLED device. Therefore, if the processes are selected correctly, the finished device 9000 only needs a protective coating for the row electrodes.

In the Embodiment-1, -2, and -3 described above, the position of the row and column electrode is exchangeable.

It should be understood that the embodiments and examples described above serve only as interpreting the subject invention, but not to limit the scope of the subject invention. After reading the subject invention, any changes and modifications without departing from the true spirit and scope of the invention by those skilled in the art are intended to be within the scope of the claims appended hereto.

For instance, in Embodiment-1 described above, the second insulation layer 7002 and the capacitor dielectric material 7001 may use the same material to reduce the manufacturing steps and therefore the production cost. Thus, as shown in FIG. 17, the method for forming a "parallel" type of Cap-OLED display may involve:

1) Obtain component 6000 (procedure for producing component 6000 is as set forth above, it is not to be repeated herein);

2) Deposit the capacitor dielectric layer 7001 on component 6000;

3) Deposit column electrodes 7003 on the capacitor dielectric material 7001, preferably, deposit column electrodes 7003 in accordance with each column of the middle electrodes 6001 in the array of the middle electrodes 6001, accordingly the column electrodes 7003 are laid parallel with a fixed spacing, and the row and column electrodes appear intersecting each other if viewing from over the device surface plane;

4) Etch the cavity 7004 that is prepared for containing the OLED device, preferably, etch at the position approximately corresponding to the center of the capacitor dielectric layer 7001 to generate the cavity 7004 that is prepared for containing the OLED device, wherein the etched cavity 7004 that is prepared for containing the OLED device penetrates the column electrode 7003 and the capacitor dielectric material 7001;

5) Deposit the organic layer 7006 (or the main part of OLED device 7008) into the cavity 7004, and deposit the transparent electrode 7007, which is electrically connected to the column electrode 7003, on top of the organic layer 7006 to form the OLED device 7008. Wherein, the transparent electrode 7007 is slightly larger than the cavity 7004 to insure that the transparent electrode 7007 can be electrically connected to the column electrode 7003.

In Embodiment-2 described above, the second insulation layer 8001 and the capacitor dielectric material 8003 is the same material, thus the manufacturing process is simplified and the production cost is further reduced. Accordingly, as shown in FIG. 18, the method for forming a "stack" type of Cap-OLED display may involve:

1) Obtain component 6000 (procedure for producing component 6000 is as set forth above, it is not to be repeated herein);

2) Deposit the capacitor dielectric material 8003 on component 6000;

3) Deposit column electrodes 8004 on the capacitor dielectric material 8003, preferably, deposit column electrodes 8004 in accordance with each column of the middle electrodes 6001 in the array of the middle electrodes 6001, accordingly the column electrodes 8004 are laid parallel with a fixed spacing, and the row and column electrodes appear intersecting each other if viewing from over the device surface plane;

4) Deposit the third insulation layer 8005, preferably, the third insulation layer 8005 covers the whole surface bearing the column electrodes;

5) Etch the third insulation layer 8005 to create i) the cavity 8006 that is prepared for accommodating the OLED device 3003, and ii) the passage 8007 that will allow the auxiliary electrode 8008 to reach the middle electrode 6001, wherein there are multiple passages 7008 around each pixel, preferably, two passages 8007, one on each side, for each pixel;

6) Deposit the auxiliary electrode 8008 into passage 8007, wherein the number of auxiliary electrodes 8008 equals the number of the passages 8007;

7) Deposit the organic layer 8009 into cavity 8006, and deposit the transparent electrode 8010, which is electrically connected to the auxiliary electrode 8008, on top of the organic layer 8009 to form the OLED device 3003. Wherein, the transparent electrode 8010 is slightly larger than the cavity 8006 to insure that the transparent electrode 8010 is electrically connected to the auxiliary electrode 8008.

In Embodiment-3 described above, the first insulation layer 9005 and the capacitor dielectric material 9007 is the same material, thus the manufacturing process is simplified and production cost is further reduced. Accordingly, as shown in FIG. 19, the method for producing a "bottom-emitting" and "parallel" type of Cap-OLED display involves the following steps:

1) Deposit the transparent electrode 9002 onto the transparent substrate 9001 according to a predetermined array;

2) Deposit the column electrodes 9003 on the transparent substrate 9001 in accordance with the individual column of the array of the transparent electrodes 9002, and etch the column electrode 9003 in the position corresponding to the transparent electrode 9002 to generate the light-emitting window 9004 for the OLED;

3) Deposit the capacitor dielectric material 9007 on the transparent substrate 9001 bearing the light-emitting windows 9004, such that the capacitor dielectric material 9007 covers the column electrodes, the gaps in between, as well as the light-emitting windows 9008;

4) Etch the capacitor dielectric material 9007 in the area corresponding to the column electrode 9003 around the light-emitting window 9004 to generate the cavity 9008, which is prepared for containing the organic layer 9009 of the OLED device 9014;

5) Deposit the organic layer 9009 of the OLED into cavity 9008, so that the organic layer 9009 is deposited on the transparent electrode 9002 to form the OLED device 9014;

6) Deposit the middle electrode 9010 on the drive-capacitor dielectric layer 9007 and the organic layer 9009. Where, the middle electrode 9010 is the cathode of the OLED device 9014;

7) Deposit the charging switch 9011 on the middle electrode 9010;

8) Deposit the second insulation layer 9012 onto the transparent substrate 9001 bearing the charging switches 9011, such that the second insulation layer 9012 fills in between the neighboring middle electrodes 9010 of the individual pixels and the neighboring charging switches 9011 of the individual pixels. Wherein, the upper surface of the charging switch 9011 is not covered by the second insulation layer 9012;

9) Deposit row electrodes 9013 onto the charging switches 9011 in accordance with the rows in the array of the charging switches 9011.

What is claimed is:

1. A capacitor-drive electroluminescent display, including a display substrate, row and column electrodes that are deposited on the display substrate, and a light-emitting pixel that is electrically connected between the row and column electrodes, which is characterized by:
the display substrate is transparent,
the light-emitting pixel includes an electroluminescent device, a drive-capacitor, and a charging switch, wherein the electroluminescent device and the drive-capacitor are connected in parallel, and then electrically connected to the charging switch;
either the row electrode or the column electrode contains a light-emitting window used for installing the electroluminescent device, and
the electroluminescent device is deposited on the display substrate via the light-emitting window,
wherein the electroluminescent device includes a transparent electrode and an organic layer, in which at least the transparent electrode is located in the light-emitting window and is electrically connected to either the row electrode or the column electrode.

2. The capacitor-drive electroluminescent display according to claim 1, which is characterized by: the light-emitting pixel also includes a middle electrode, wherein the electroluminescent device and the drive-capacitor are electrically connected to one side of the middle electrode in parallel, whereas the other side of the middle electrode is electrically connected to the charging switch.

3. The capacitor-drive electroluminescent display according to claim 1, which is characterized by: the row electrode or the column electrode is embedded into the display substrate.

4. The capacitor-drive electroluminescent display according to claim 2, which is characterized by: the light-emitting pixel includes a first insulation layer and a second insulation layer, wherein the first insulation layer isolates and insulates neighboring charging switches, and the second insulation layer isolates and insulates neighboring electroluminescent devices, neighboring drive-capacitors, and neighboring middle electrodes, respectively.

5. The capacitor-drive electroluminescent display according to claim 2, which is characterized by: the light-emitting pixel also includes a first insulation layer and a second insulation layer, wherein the first insulation layer isolates and insulates neighboring row or column electrodes and neighboring drive-capacitors, respectively, whereas the second insulation layer isolates and insulates neighboring charging switches and neighboring middle electrodes.

6. The capacitor-drive electroluminescent display according to claim 4 or 5, which is characterized by: the second insulation layer consists of the same material as that used for the drive-capacitor.

7. The capacitor-drive electroluminescent display according to claim 6, which is characterized by: the transparent electrode is deposited via a shadow mask on the surface of the organic layer and on the row or column electrode at the light-emitting window.

8. The capacitor-drive electroluminescent display according to claim 1 or 5, which is characterized by: the electroluminescent device includes a transparent electrode and an organic layer, wherein the transparent electrode and part of the organic layer are located in the light-emitting window, and is electrically connected to the row or column electrode.

9. The capacitor-drive electroluminescent display according to claim 8, which is characterized by: the transparent electrode is coated on the display substrate at the light-emitting window via deposition.

10. The capacitor-drive electroluminescent display according to any of claims 1 to 4, which is characterized by: the charging switch is formed directly on the row or column electrode.

11. The capacitor-drive electroluminescent display according to claim 10, which is characterized by: the charging switch is a diode.

12. The capacitor-drive electroluminescent display according to claim 2 or 4, which is characterized by: the middle electrode is obtained by metal coating on the charging switch.

13. A capacitor-drive electroluminescent display, including a display substrate, row and column electrodes deposited on the display substrate, and a light-emitting pixel electrically connected between the row and column electrodes, which is characterized by:
the light-emitting pixel includes an electroluminescent device, a drive-capacitor, a charging switch, a middle electrode, and an auxiliary electrode, wherein one end of the drive-capacitor is electrically connected to one side of the middle electrode, and the other end to one side of the row or column electrode, whereas one end of the electroluminescent device is electrically connected to the other side of the row or column electrode, and the other end to the middle electrode via the auxiliary electrode, and the other side of the middle electrode is electrically connected to the charging switch.

14. The capacitor-drive electroluminescent display according to claim 13, which is characterized by: the row or column electrode is embedded into the substrate.

15. The capacitor-drive electroluminescent display according to claim 14, which is characterized by: the light-emitting pixel also includes a first insulation layer, a second insulation layer, and a third insulation layer, wherein the first insulation layer isolates and insulates neighboring charging switches, and the second insulation layer isolates and insulates neighboring drive-capacitors and neighboring middle electrodes, respectively, and the third insulation layer isolates and insulates neighboring row or column electrodes and neighboring electroluminescent devices, respectively.

16. The capacitor-drive electroluminescent display according to claim 15, which is characterized by: the second insulation layer consists of the same material as that of the drive-capacitor.

17. The capacitor-drive electroluminescent display according to any of claims 13-16, which is characterized by: the electroluminescent device includes a transparent electrode and an organic layer, wherein the transparent electrode is electrically connected to the auxiliary electrode.

18. The capacitor-drive electroluminescent display according to claim 17, which is characterized by: the transparent electrode is deposited on the surface of the organic layer and the relevant part of the auxiliary electrode via a shadow-mask.

19. A method for producing a capacitor-drive electroluminescent display, which includes:
depositing column electrodes on a display substrate;
depositing row electrodes on the display substrate;
depositing a charging switch on the row or column electrodes;
depositing a middle electrode on the charging switch;
depositing a drive-capacitor on the middle electrode;
depositing an electroluminescent device on the middle electrode;
depositing an auxiliary electrode on the middle electrode;
wherein the electroluminescent device and the drive-capacitor are located at opposite sides of the column or row electrode, and the drive-capacitor is located between the middle electrode and the column or row electrodes, whereas the auxiliary electrode electrically connects the electroluminescent device and the middle electrode, such that the electroluminescent device and the drive-capacitor are electrically connected in parallel.

20. A method for producing a capacitor-drive electroluminescent display, which includes:
depositing a column electrode on a transparent display substrate;
depositing an electroluminescent device directly on the transparent display substrate, such that the electroluminescent device is electrically connected to the column electrode;
depositing a drive-capacitor on the column electrode;
depositing a charging switch on the drive-capacitor;
depositing a row electrode on the charging switch;
wherein the electroluminescent device and the drive-capacitor are connected in parallel, and then electrically connected to the charging switch.

\* \* \* \* \*